United States Patent [19]
Nakao

[11] Patent Number: 5,418,499
[45] Date of Patent: May 23, 1995

[54] RING OSCILLATOR HAVING SELECTABLE NUMBER OF INVERTER STAGES

[75] Inventor: Kenji Nakao, Sagamihara, Japan

[73] Assignee: Mitsubishi Denki Kabushiki Kaisha, Tokyo, Japan

[21] Appl. No.: 274,100

[22] Filed: Jul. 12, 1994

[30] Foreign Application Priority Data

Aug. 31, 1993 [JP] Japan .................................. 5-216014

[51] Int. Cl.6 .......................................... H03K 3/354
[52] U.S. Cl. ................................. 331/57; 331/177 R; 331/179
[58] Field of Search ................... 331/57, 177 R, 179

[56] References Cited

U.S. PATENT DOCUMENTS

| | | | |
|---|---|---|---|
| 4,517,532 | 5/1985 | Neidorff | 331/179 X |
| 4,978,927 | 12/1990 | Hausman et al. | 331/57 |
| 5,331,294 | 7/1994 | Watanabe et al. | 331/57 |

Primary Examiner—Siegfried H. Grimm

Attorney, Agent, or Firm—Oblon, Spivak, McClelland, Maier & Neustadt

[57] ABSTRACT

A ring oscillator wherein an inverter group includes five inverters (G1 to G5) connected in series, the output of the inverter (G3) is connected to the input of the first inverter (G1) through a transfer gate (TF1), and the output of the inverter (G5) is connected to the input of the inverter (G1) through a transfer gate (TF2). The ring oscillator is adapted such that, when a switching signal (S3) is "L", the CMOS transfer gates (TF1) and (TF2) are on and off, respectively, and the three inverters (G1 to G3) are connected in a loop whereas the inverters (G4, G5) function as buffers receiving the output of the inverter (G3), to provide an oscillation signal (S2) produced by the three inverters (G1 to G3) forming the loop from an output terminal (2) and such that, when the switching signal (S3) is "H", the oscillation signal (S2) produced by the five inverters (G1 to G5) forming the loop is provided, whereby the oscillation signal has a wide range of variable oscillation frequency bands.

16 Claims, 20 Drawing Sheets

F I G. 2
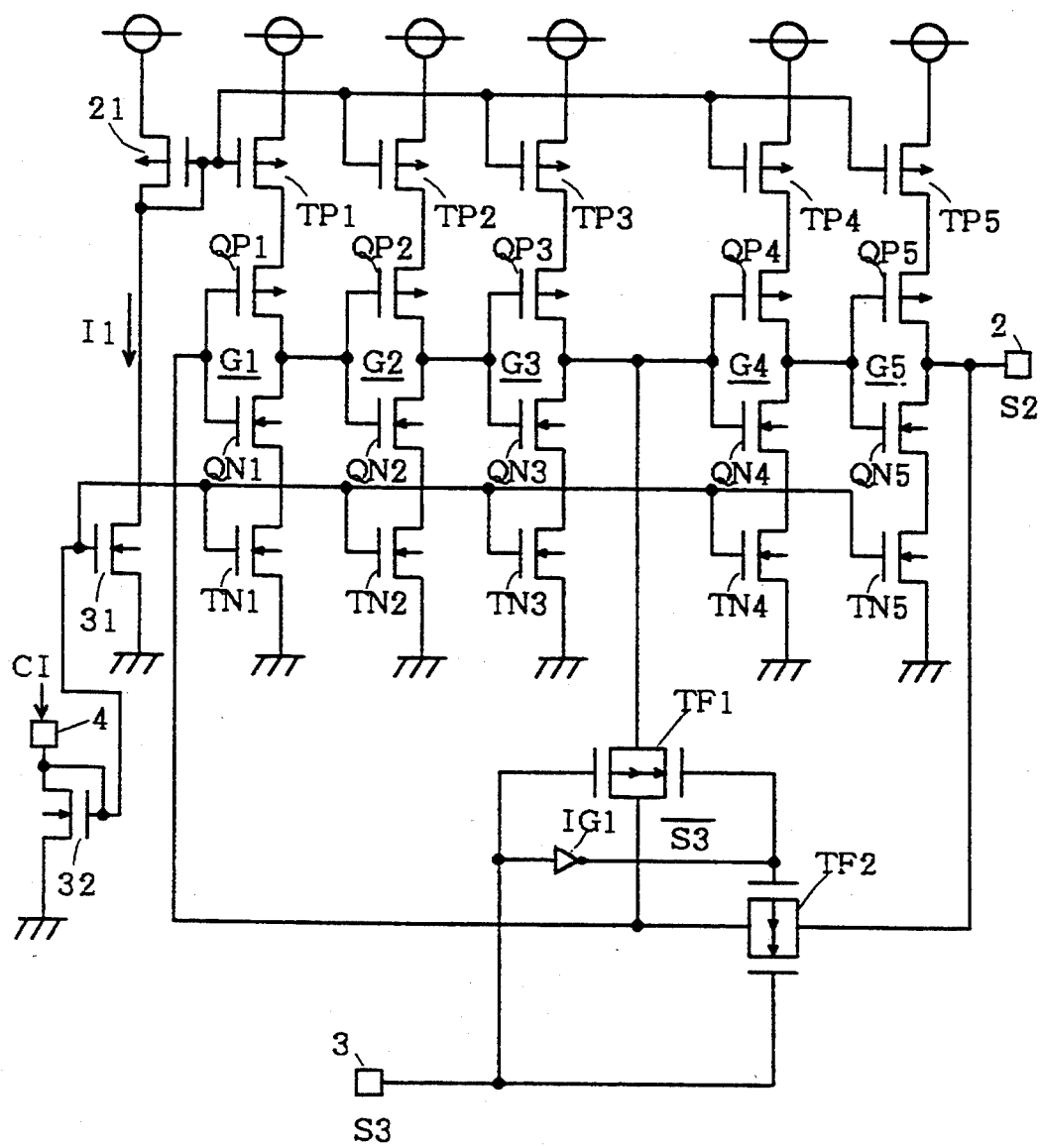

6

RING OSCILLATOR HAVING SELECTABLE NUMBER OF INVERTER STAGES

BACKGROUND OF THE INVENTION

1. Field of the Invention

The present invention relates to a ring oscillator for use in a voltage-controlled oscillator for a PLL circuit.

2. Description of the Background Art

FIG. 19 is a circuit diagram showing the internal construction of a conventional voltage-controlled ring oscillator. Referring to FIG. 19, five inverters Gi (i=1 to 5), or G1 to G5, each basically comprised of a CMOS structure including a PMOS transistor QPi and an NMOS transistor QNi are connected in series to form an inverter group. The output of the last inverter G5 is outputted in the form of an oscillation signal S2 from an output terminal 2 to the exterior and is fed back to the input of the first inverter G1 to form a five-stage loop.

In each inverter Gi, the source of the PMOS transistor QPi is connected to a power supply VDD through a PMOS transistor TPi and the source of the NMOS transistor QNi is grounded through an NMOS transistor TNi.

A PMOS transistor 21 and an NMOS transistor 31 are connected in series between the power supply VDD and ground, and the PMOS transistor 21 is current-mirror connected to the PMOS transistors TP1 to TP5. The gate of the NMOS transistor 31 is connected to a voltage control terminal 1 and is commonly connected to the NMOS transistors TN1 to TN5. A control voltage CV is applied to the voltage control terminal 1.

In this manner, an odd number of (five) inverters are connected in a loop to provide the oscillation signal S2 oscillating at a predetermined oscillation frequency f at the output terminal 2 connected to the output of the inverter G5. The oscillation frequency f of the oscillation signal S2 is determined by the number of inverters forming the loop and the signal propagation delay time of the individual inverters.

The amount of current flowing in the NMOS transistor 31 is controlled by the magnitude of the control voltage CV applied to the voltage control terminal 1, thereby to determine a control current I1 flowing in the PMOS transistor 21.

Consequently, the gates of the NMOS transistors TN1 to TN5 are also connected to the voltage control terminal 1, and the PMOS transistors TP1 to TP5 form current mirror circuits with the PMOS transistor 21. Thus, the source current of each inverter Gi is controlled so that the amount of the source current is proportional to the control current I1.

That is, the control voltage CV applied to the voltage control terminal 1 controls the source current of each inverter Gi, thereby to change the signal propagation delay time of each inverter Gi to change the oscillation frequency f of the oscillation signal S2.

The ring oscillator as above constructed is used as a clock source 44 for generating a clock CK for operating circuits 41 to 43 formed in an IC chip 10 as shown in FIG. 20. The ring oscillator is also used as a VCO 53 for a PLL circuit including a phase comparator 51, a low-pass filter 52 and the VCO 53 for locking the phase of an output signal OUT into that of a reference signal F0 as shown in FIG. 21.

In the conventional voltage-controlled ring oscillator as above constructed, the oscillation frequency f of the oscillation signal S2 has been changed by the control voltage CV applied to the voltage control terminal 1.

However, since the conventional ring oscillator includes a fixed number of inverters connected in a loop, changes of the oscillation frequency f of the oscillation signal S2 depend only upon control of the signal propagation delay time of the individual inverters Gi by the control voltage CV.

Unfortunately, the control range of the signal propagation delay time of the individual inverters Gi by the control voltage CV is limited to a level which prevents the malfunction of the inverters. Accordingly, the frequency band of the oscillation frequency f of the oscillation signal S2 which can be varied by the control voltage CV is limited to that of a narrow width.

Furthermore, since decrease in voltage value of the power supply VDD decreases the source current of the inverters, the frequency band of the oscillation frequency f which can be controlled by the control voltage CV is further reduced if the conventional voltage-controlled ring oscillator is operated by the power supply VDD having a low voltage. It has therefore been impossible to output the oscillation signal S2 having the same oscillation frequency in the cases of the power supply voltages of 5 V and 3 V under control of the control voltage CV of the conventional ring oscillator.

SUMMARY OF THE INVENTION

According to the present invention, a ring oscillator comprises: an inverter group including first to N-th inverters (N is an odd number satisfying $N \geq 3$) connected in series, the output of the N-th inverter being outputted to the exterior in the form of an oscillation signal, and switching means receiving a switching signal for determining the number K of inverters (K is an odd number satisfying $1 \leq K \leq N$) forming a loop in the inverter group on the basis of the switching signal to feed back the output of the K-th inverter to the input of the first inverter, the switching means using the (K+1)-th to N-th inverters in the inverter group as a buffer for deriving the oscillation signal when K<N.

This enables the switching signal to variably control the number of inverters forming the loop in the inverter group to control the oscillation frequency of the oscillation signal in a wide range of frequency bands.

The switching means uses the (K+1)-th to N-th inverters in the inverter group as buffers for deriving the oscillation signal when K<N. The inverters which do not form the loop are utilized, and their inputs are prevented from being floating.

According to another feature of the present invention, the ring oscillator comprises: an inverter group including first to N-th inverters (N is an odd number satisfying $N \geq 3$) connected in series; power supply detecting means receiving a power supply voltage for outputting a power supply detection signal on the basis of the value of the power supply voltage; and switching means for determining the number K of inverters (K is an odd number satisfying $1 \leq K \leq N$) forming a loop in the inverter group on the basis of the power supply detection signal to feed back the output of the K-th inverter to the input of the first inverter and provide the output of the K-th inverter in the form of an oscillation signal.

The number of inverters forming the loop in the inverter group is automatically variably controlled as the value of the power supply voltage varies, and the oscillation frequency of the oscillation signal is controlled in a wide range of frequency bands.

According to a third feature of the present invention, the ring oscillator comprises: an inverter group including first to N-th inverters (N is an odd number satisfying $N \geq 3$) connected in series; a shift register serially receiving serial input data for outputting storage data having the serial input data in parallel in the form of a plurality of shift output signals; and switching means for determining the number K of inverters (K is an odd number satisfying $1 \leq K \leq N$) forming a loop in the inverter group on the basis of the plurality of shift output signals to feed back the output of the K-th inverter to the input of the first inverter and provide the output of the K-th inverter in the form of an oscillation signal.

The number of inverters forming the loop in the inverter group may be variably controlled on the basis of the serial input data, and the oscillation frequency of the oscillation signal is controlled in a wide range of frequency bands.

In addition, since the signal given from the exterior is only the serial input data to be applied to the shift register, the number of external input pins is minimized.

According to a fourth feature of the present invention, the ring oscillator comprises: an inverter group including first to N-th inverters (N is an odd number satisfying $N \geq 3$) connected in series; and switching means receiving a switching signal for determining the number K of inverters (K is an odd number satisfying $1 \leq K \leq N$) forming a loop in the inverter group on the basis of the switching signal to feed back the output of the K-th inverter to the input of the first inverter and output the output of the K-th inverter in the form of an oscillation signal, the switching means fixing the output values of the (K+1)-th to N-th inverters in the inverter group when $K \leq N$.

The switching signal can variably control the number of inverters forming the loop in the inverter group.

Consequently, the number of inverters forming the loop in the inverter group is variably controlled by the switching signal, and the oscillation frequency of the oscillation signal is controlled in a wide range of frequency bands.

Further, the switching means fixes the output values of the (K+1)-th to N-th inverters in the inverter group when $K \leq N$, to suppress useless current flow in the inverters which do not form the loop for less power consumption.

Preferably, the ring oscillator further comprises: current amount control means receiving a control voltage for changing the amount of current flowing in each of the inverters in the inverter group on the basis of the control voltage.

The signal propagation delay time of all the inverters forming the loop in the inverter group is controlled on the basis of the control voltage, whereby the oscillation frequency of the oscillation signal is controlled.

Preferably, the ring oscillator further comprises: current amount control means receiving a control current for changing the amount of current flowing in each of the inverters in the inverter group on the basis of the control current.

The signal propagation delay time of all the inverters forming the loop in the inverter group is controlled on the basis of the control current, whereby the oscillation frequency of the oscillation signal is controlled accurately.

According to a fifth feature of the present invention, the ring oscillator comprises: an inverter group including first to N-th inverters (N is an odd number satisfying $N \geq 3$) connected in series for feeding back the output of the N-th inverter to the input of the first inverter and providing the output of the N-th inverter in the form of an oscillation signal; first current amount control means receiving a first control voltage for changing the amount of current flowing in some of the N inverters forming the inverter group on the basis of the first control voltage; and second current amount control mean receiving a second control voltage for changing the amount of current flowing in some others of the N inverters forming the inverter group on the basis of the second control voltage.

The signal propagation delay time of all the inverters forming the loop in the inverter group is controlled on the basis of a combination of the first and second control voltages.

The first control voltage roughly changes the oscillation frequency of the oscillation signal whereas the second control voltage finely changes the oscillation frequency of the oscillation signal, whereby the oscillation frequency of the oscillation signal is controlled accurately in a wide range of frequency bands.

It is an object of the present invention to provide a ring oscillator whose oscillation signal has a wide range of variable oscillation frequency bands.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a circuit diagram of the ring oscillator of a second aspect of the first preferred embodiment according to the present invention;

DESCRIPTION OF THE PREFERRED EMBODIMENTS

First Preferred Embodiment

A ring oscillator of a first preferred embodiment according to the present invention will be described hereinafter, in which N=5 and K={3, 5} where N is the number of inverters being used and K is the number of inverters forming a loop.

Figure 1:
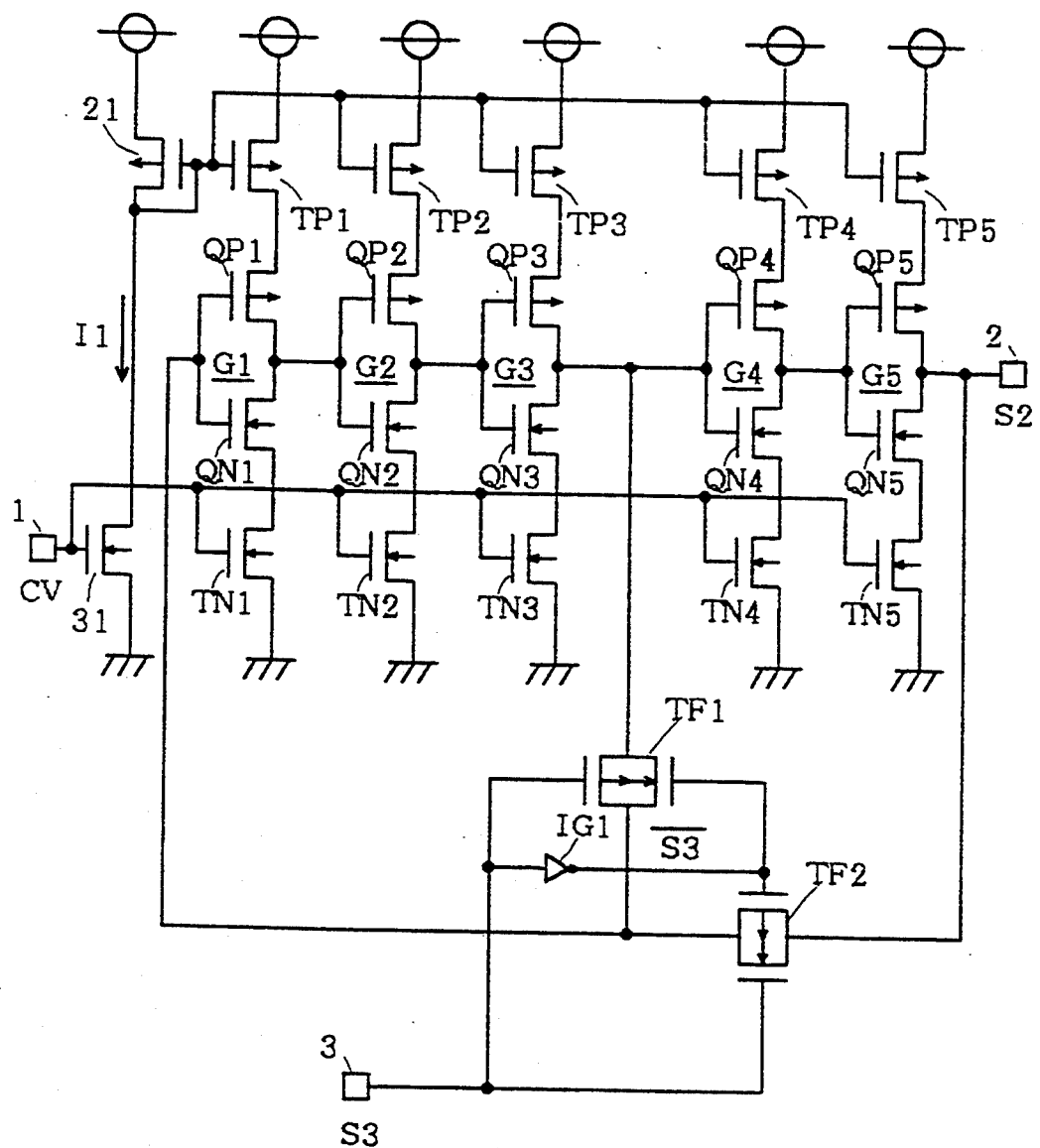
FIG. 1 is a circuit diagram of a ring oscillator of a first aspect of a first preferred embodiment according to the present invention.

FIG. 1 is a circuit diagram of the ring oscillator of a first aspect of the first preferred embodiment according to the present invention. As shown in FIG. 1, five inverters Gi (i=1 to 5), or G1 to G5, each basically comprised of a CMOS structure including in-series connected PMOS transistor QPi and NMOS transistor QNi are connected in series to form an inverter group, the output of the last inverter G5 being outputted in the form of an oscillation signal S2 from an output terminal 2.

The output of the third inverter G3 is connected to the input of the first inverter G1 through a transfer gate TF1, and the output of the last inverter G5 is connected to the input of the inverter G1 through a transfer gate TF2.

In each inverter Gi, the source of the PMOS transistor QPi is connected to a power supply VDD through a PMOS transistor TPi and the source of the NMOS transistor QNi is grounded through an NMOS transistor TNi.

A switching signal S3 from a terminal 3 for switching the number of inverters forming a loop is applied to a PMOS gate of the CMOS transfer gate TF1 and an NMOS gate of the CMOS transfer gate TF2. An inverter IG1 inverts the switching signal S3 to provide an inverted switching signal $\overline{S3}$ which is in turn applied to an NMOS gate of the CMOS transfer gate TF1 and a PMOS gate of the CMOS transfer gate TF2.

A PMOS transistor 21 and an NMOS transistor 31 are connected in series between the power supply VDD and ground, and the PMOS transistor 21 is current-mirror connected to the PMOS transistors TP1 to TP5. The gate of the NMOS transistor 31 is connected to a voltage control terminal 1 and is commonly connected to the NMOS transistors TN 1 to TN5. A control voltage CV is applied to the voltage control terminal 1.

In such an arrangement, when the switching signal S3 is "H", the CMOS transfer gate TF1 is off and the CMOS transfer gate TF2 is on. Then the five inverters G1 to G5 are connected in a loop to provide the oscillation signal S2 produced by the five inverters G 1 to G5 from the output terminal 2 connected to the output of the inverter G5.

On the other hand, when the switching signal S3 is "L", the CMOS transfer gate TF1 is on and the CMOS transfer gate TF2 is off. Then the three inverters G1 to G3 are connected in a loop and the inverters G4 and G5 serve as buffers receiving the output of the inverter G3. The oscillation signal S2 produced by the three inverters G1 to G3 is provided from the output terminal 2 connected to the output of the inverter G5.

In this manner, the oscillation frequency f of the oscillation signal S2 may be changed in a relatively wide range of frequency bands by changing the number of inverters forming the loop between five and three by "H"/"L" switching of the switching signal S3.

The oscillation frequency f is made low by increasing the number of inverters forming the loop and is made high by decreasing it.

In addition, when the three inverters form the loop, the inverters G4 and G5 which do not form the loop are effectively used as buffers to prevent the inputs of the inverters G4 and G5 from being floating.

Like the background art, the control voltage CV applied to the voltage control terminal 1 may control the source current of each inverter Gi, thereby to change the signal propagation delay time of each inverter Gi and, accordingly, the signal propagation delay time of all the inverters forming the loop. This permits changes of the oscillation frequency f of the oscillation signal S2.

FIG. 2 is a circuit diagram of the ring oscillator of a second aspect of the first preferred embodiment. As shown in FIG. 2, an NMOS transistor 32 is current-mirror connected to the NMOS transistor 31. The drain and gate of the NMOS transistor 32 are connected to a current control terminal 4 and the source thereof is grounded. A control current CI is applied to the current control terminal 4. Changing of the oscillation frequency f of the oscillation signal S2 based on the switching signal S3 and other constructions of FIG. 2 are similar to those of the ring oscillator of FIG. 1, and the description thereof will be omitted herein.

In such an arrangement, a control current I1 flowing in the PMOS transistor 21 is determined by controlling the amount of current flowing in the NMOS transistor 31 on the basis of the magnitude of the control current CI applied to the current control terminal 4.

Consequently, the gates of the NMOS transistors TN1 to TN5 are also connected to the current control terminal 4, and the PMOS transistors TP1 to TP5 form current mirror circuits with the PMOS transistor 21. Thus the source current of each inverter Gi is controlled so that the amount of the source current is proportional to the control current I1.

That is, the control current CI from the current control terminal 4 controls the source current of each inverter Gi, thereby to change the signal propagation delay time of each inverter Gi and, accordingly, the signal propagation delay time of all the inverters forming the loop. This permits changes of the oscillation frequency f of the oscillation signal S2.

Figure 3:
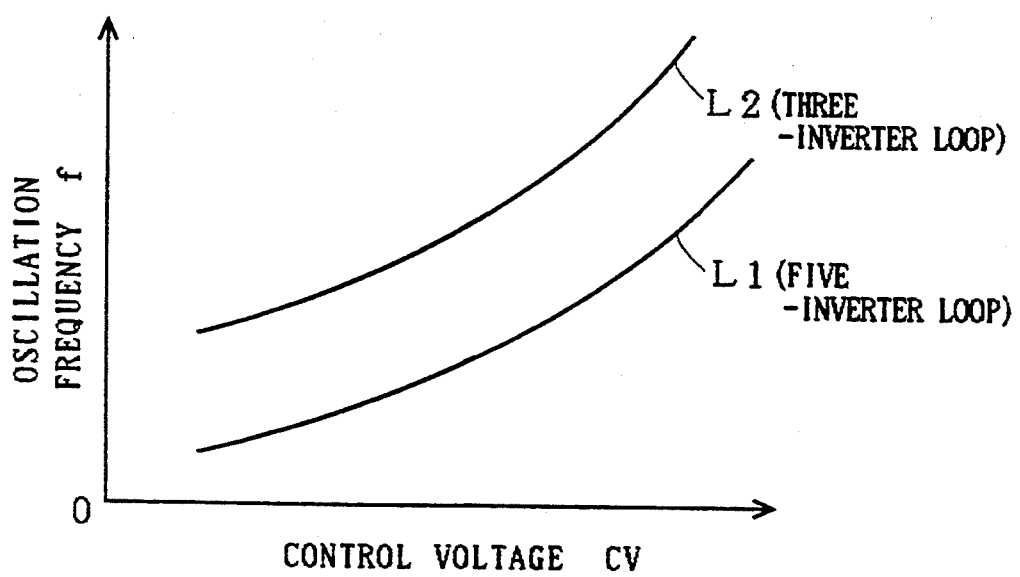
FIG. 3 is a graph showing oscillation frequency characteristics based on a control voltage of the ring oscillator of FIG. 1.

FIG. 3 is a graph showing relation between the control voltage CV and the oscillation frequency f in the ring oscillator of FIG. 1. Referring to FIG. 3, the curve L1 represents the five-inverter loop and the curve L2 represents the three-inverter loop. As the control voltage CV increases, the curves L1 and L2 become rising curves but are non-linear. It is therefore relatively difficult to control the oscillation frequency f by the control voltage CV.

Figure 4:
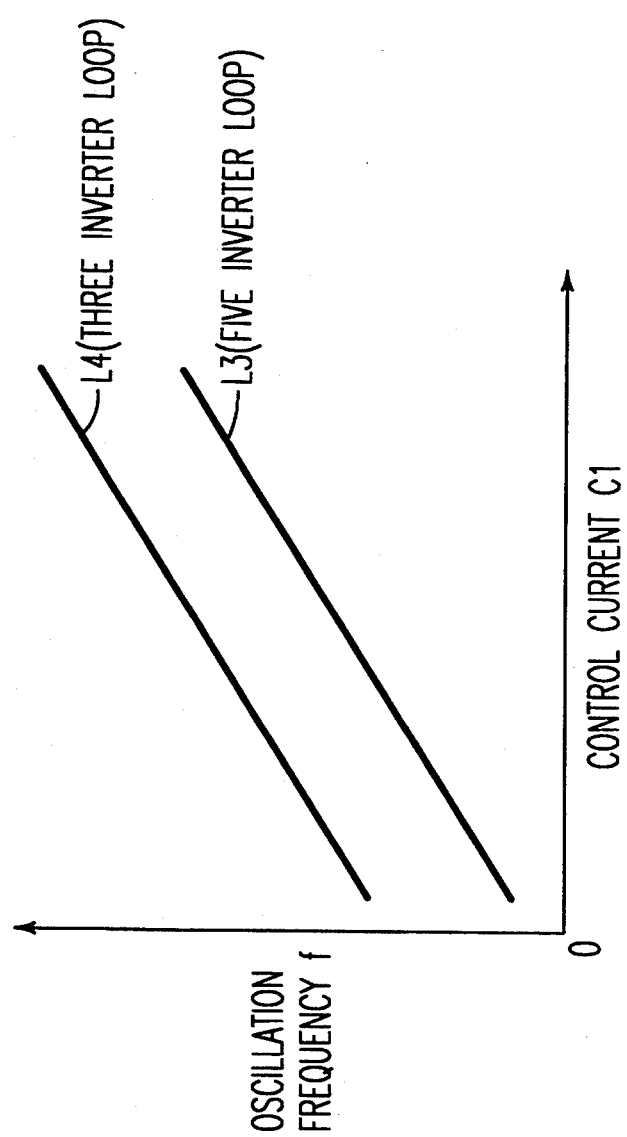
FIG. 4 is a graph showing oscillation frequency characteristics based on a control current of the ring oscillator of FIG. 2.

FIG. 4 is a graph showing relation between the control current CI and the oscillation frequency f in the ring oscillator of FIG. 2. Referring to FIG. 4, the curve L3 represents the five-inverter loop and the curve L4 represents the three-inverter loop. The oscillation frequency f changes linearly in proportion to the control current CI. It is therefore relatively easy to control the oscillation frequency f by the control current CI.

The second aspect of the first preferred embodiment is more advantageous than the first aspect thereof in ease of control of the oscillation frequency f since the control of the oscillation frequency f by the control current CI of the second aspect is substituted for the control of the oscillation frequency f by the control voltage CV of the first aspect.

Second Preferred Embodiment

The ring oscillator of a second preferred embodiment according to the present invention will now be described where N=5 and K={3, 5}.

Figure 5:
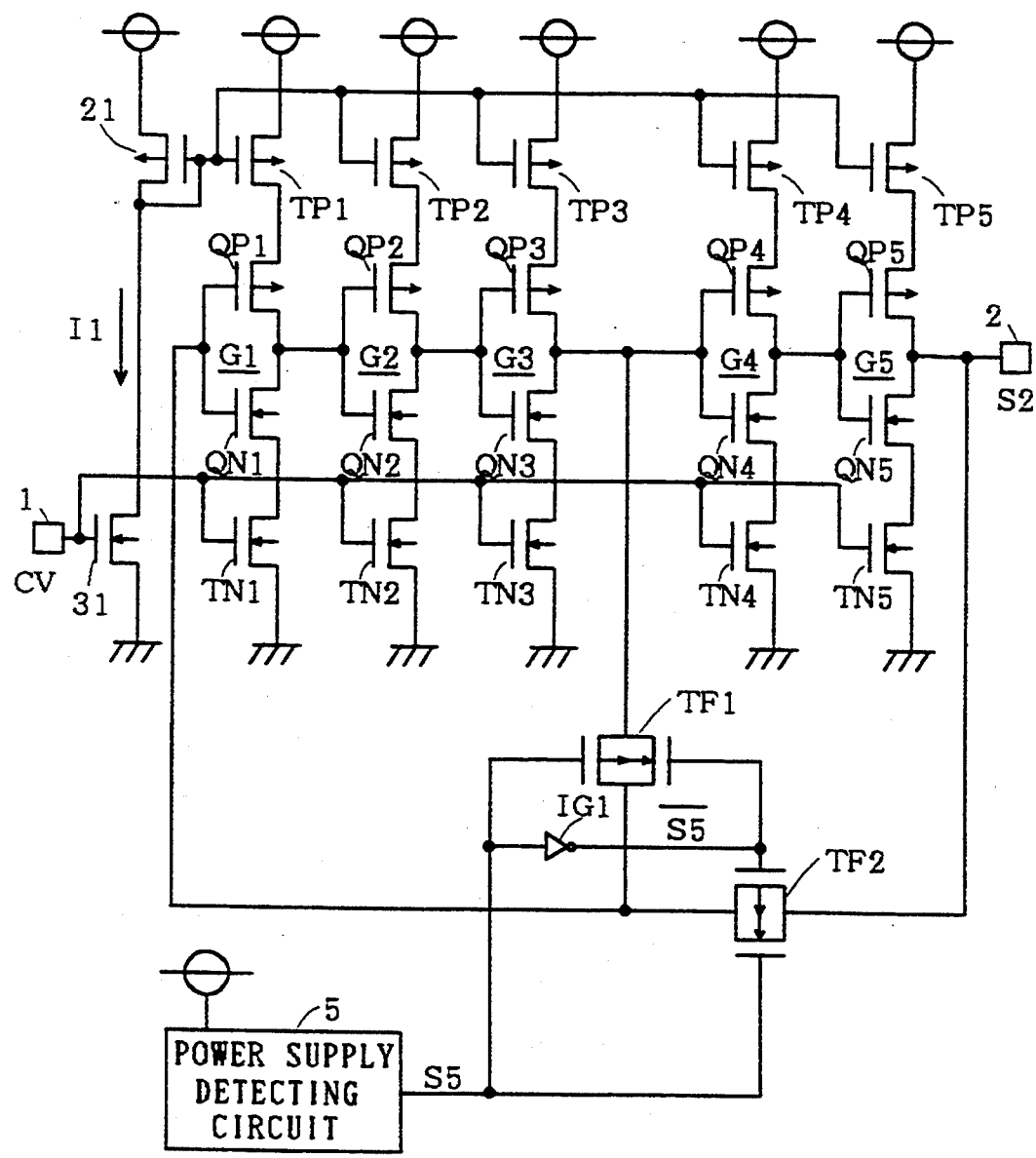
FIG. 5 is a circuit diagram of the ring oscillator of a first aspect of a second preferred embodiment according to the present invention.

FIG. 5 is a circuit diagram of the ring oscillator of a first aspect of the second preferred embodiment according to the present invention. As shown in FIG. 5, five inverters Gi (i=1 to 5), or G1 to G5, each basically comprised of a CMOS structure including in-series connected PMOS transistor QPi and NMOS transistor QNi are connected in series to form an inverter group, the output of the last inverter G5 being outputted in the form of the oscillation signal S2 from the output terminal 2.

The output of the third inverter G3 is connected to the input of the first inverter G1 through the transfer gate TF1, and the output of the last inverter G5 is connected to the input of the inverter G1 through the transfer gate TF2.

A power supply detecting circuit 5 is connected to the power supply VDD and outputs a power supply detection signal S5 on the basis of the voltage value of the power supply VDD. The power supply detection signal S5 is applied to the PMOS gate of the CMOS transfer gate TF1 and the NMOS gate of the CMOS transfer gate TF2. The inverter IG1 inverts the power supply detection signal S5 to provide an inverted power supply detection signal $\overline{S5}$ which is in turn applied to the NMOS gate of the CMOS transfer gate TF1 and the PMOS gate of the CMOS transfer gate TF2.

Other constructions of FIG. 5 are similar to those of the first aspect of the first preferred embodiment shown in FIG. 1, and the description thereof will be omitted herein.

Figure 6:
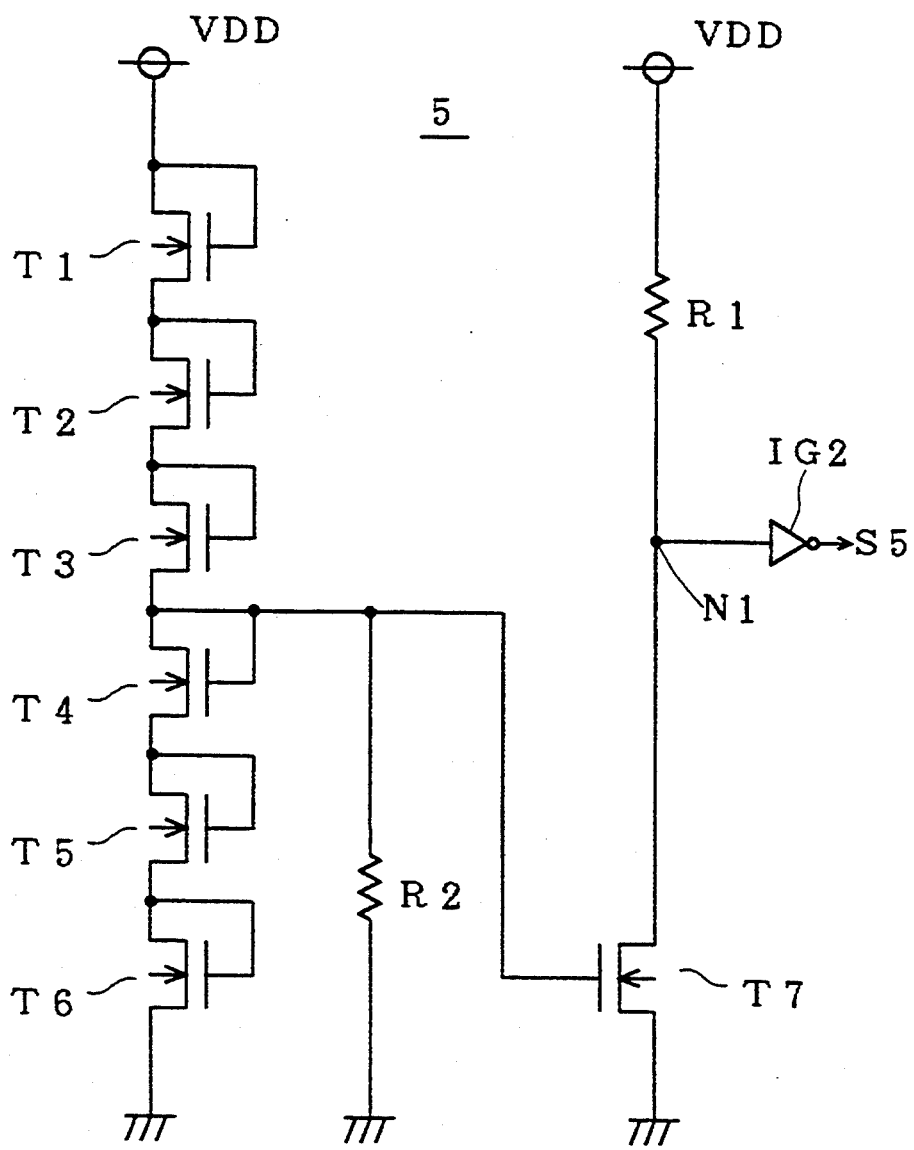
FIG. 6 is a circuit diagram showing the internal construction of a power supply detecting circuit shown in FIG. 5.

FIG. 6 is a circuit diagram showing the internal construction of the power supply detecting circuit 5 of FIG. 5. As shown in FIG. 6, NMOS transistors T1 to T6 having commonly connected drains and gates are diode connected in series between the power supply and ground. A resistor R1 and an NMOS transistor T7 are connected in series between the power supply and ground. The drain and gate of the fourth NMOS transistor T4 are connected to the gate of the NMOS transistor T7 and are grounded through a resistor R2.

The input of an inverter IG2 is connected to a node N1 between the resistor R1 and the drain of the NMOS transistor T7, and the output of the inverter IG2 serves as the power supply detection signal S5. The threshold voltage $V_{TH}$ of the respective NMOS transistors T1 to T7 is set to about 0.7 V. The resistance of the resistor R2 is sufficiently larger than the on-resistance of the NMOS transistors T1 to T6.

In such an arrangement, when the power supply voltage VDD is less than 4.2 V (where the voltage drop for one transistor is (0.7 V), the NMOS transistors T1 to T6 are not fully on, and the gate voltage of the NMOS transistor T7 is "L" (ground level) through the resistor R2. The NMOS transistor T7 is off, and the power supply detection signal S5 is "L".

On the other hand, when the power supply voltage VDD is more than 4.2 V, the NMOS transistors T1 to T6 are fully on, and the gate voltage of the NMOS transistor T7 is not less than 2.1 V which sufficiently exceeds the threshold voltage (0.7 V) of the NMOS transistor T7. Then the NMOS transistor T7 is on and the power supply detection signal S5 is "H".

Thus the power supply voltage VDD of 5 V ensures "H" of the power supply detection signal S5 and the power supply voltage VDD of 3 V ensures "L" of the power supply detection signal S5.

In such an arrangement, when the voltage value of the power supply VDD is 3 V, the power supply detection signal S5 is "L", the CMOS transfer gate TF1 is on, and the CMOS transfer gate TF2 is off. Then the three inverters G1 to G3 are connected in a loop, and the inverters G4 and G5 serve as buffers receiving the output of the inverter G3. The oscillation signal S2 produced by the three inverters G1 to G3 forming the loop is provided from the output terminal 2 connected to the output of the inverter G5.

On the other hand, when the voltage value of the power supply VDD is 5 V, the power supply detection signal S5 is "H", the CMOS transfer gate TF1 is off, and the CMOS transfer gate TF2 is on. Then the five inverters G1 to G5 are connected in a loop, and tile oscillation signal S2 produced by the five inverters G1 to G5 forming the loop is provided from the output terminal 2 connected to the output of the inverter G5.

In this manner, changing the number of inverters forming the loop between five and three by "H"/"L" switching of the power supply detection signal S5 based on the voltage value 5 V/3 V of the power supply VDD, changes the oscillation frequency f of the oscillation signal S2 in a relatively wide range of frequency bands. That is, the oscillation frequency f is made low by increasing the number of inverters forming the loop and is made high by decreasing it.

In addition, when the three inverters form the loop, the inverters G4 and G5 which do not form the loop are used as buffers to prevent the inputs of the inverters G4 and G5 from being floating.

Like the background art, the control voltage CV applied to the voltage control terminal 1 may control the source current of each inverter Gi, thereby to change the signal propagation delay time of each inverter Gi and, accordingly, the signal propagation delay time of all the inverters forming the loop. This permits changes of the oscillation frequency f of the oscillation signal S2.

The ring oscillator of the above-mentioned construction allows the power supply VDD having two voltage values 5 V and 3 V to output the oscillation signal S2 having the same oscillation frequency f. This is discussed below on the assumption that the control voltage CV is constant.

Figure 7:
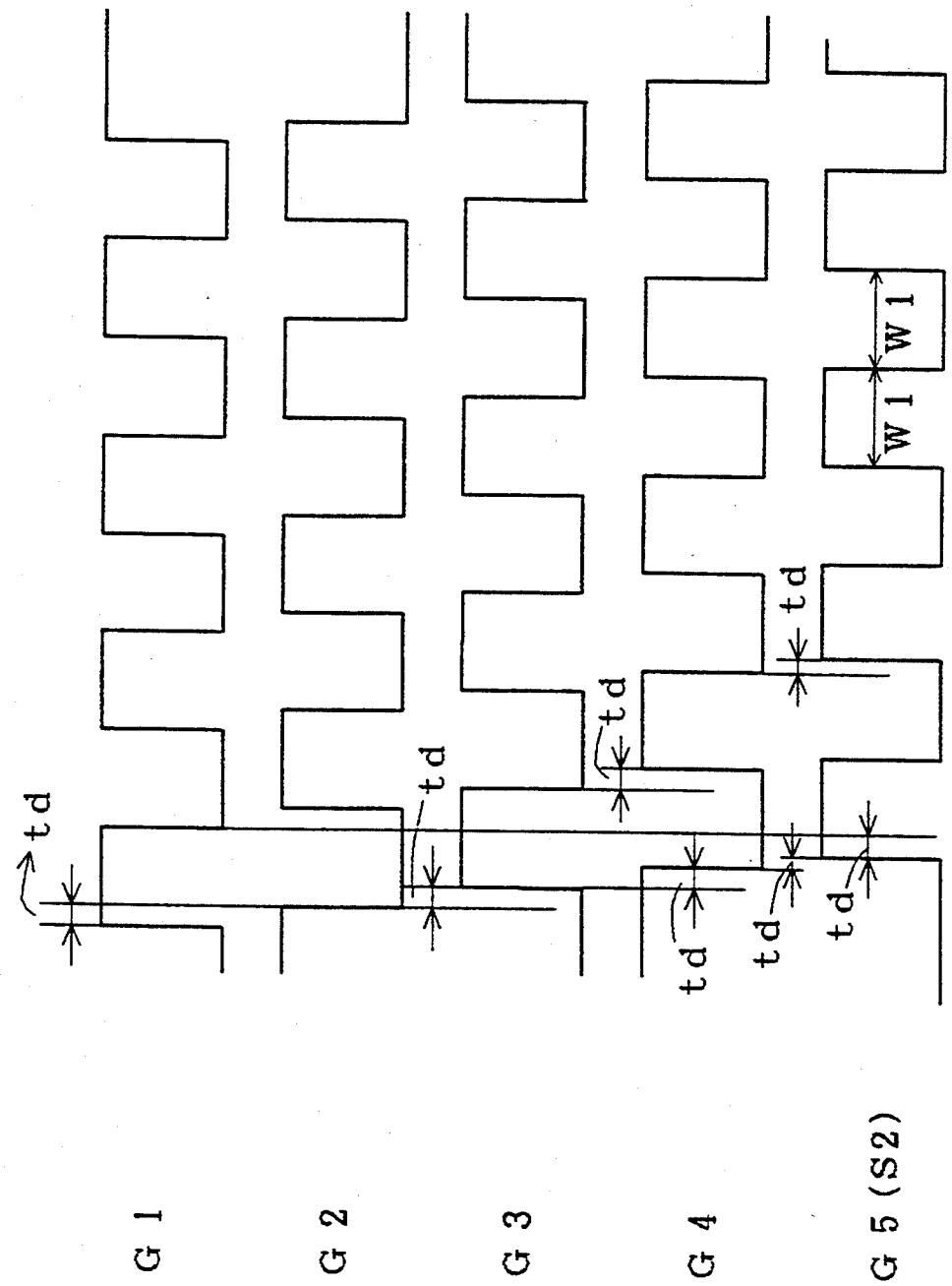
FIGS. 7 to 10 are timing charts showing the operation of the ring oscillator of FIG. 5.

When the power supply voltage VDD is 5 V, the respective inverters G1 to G5 have a relatively short signal propagation delay time td as shown in FIG. 7. At this time, the power supply detection signal S5 is "H", the CMOS transfer gate TF1 is off, and the CMOS transfer gate TF2 is on. Then the oscillation signal S2 is that produced by the five inverters G1 to G5 forming the loop. Consequently, the oscillation signal S2 has a pulse width W1=5·td.

Figure 8:
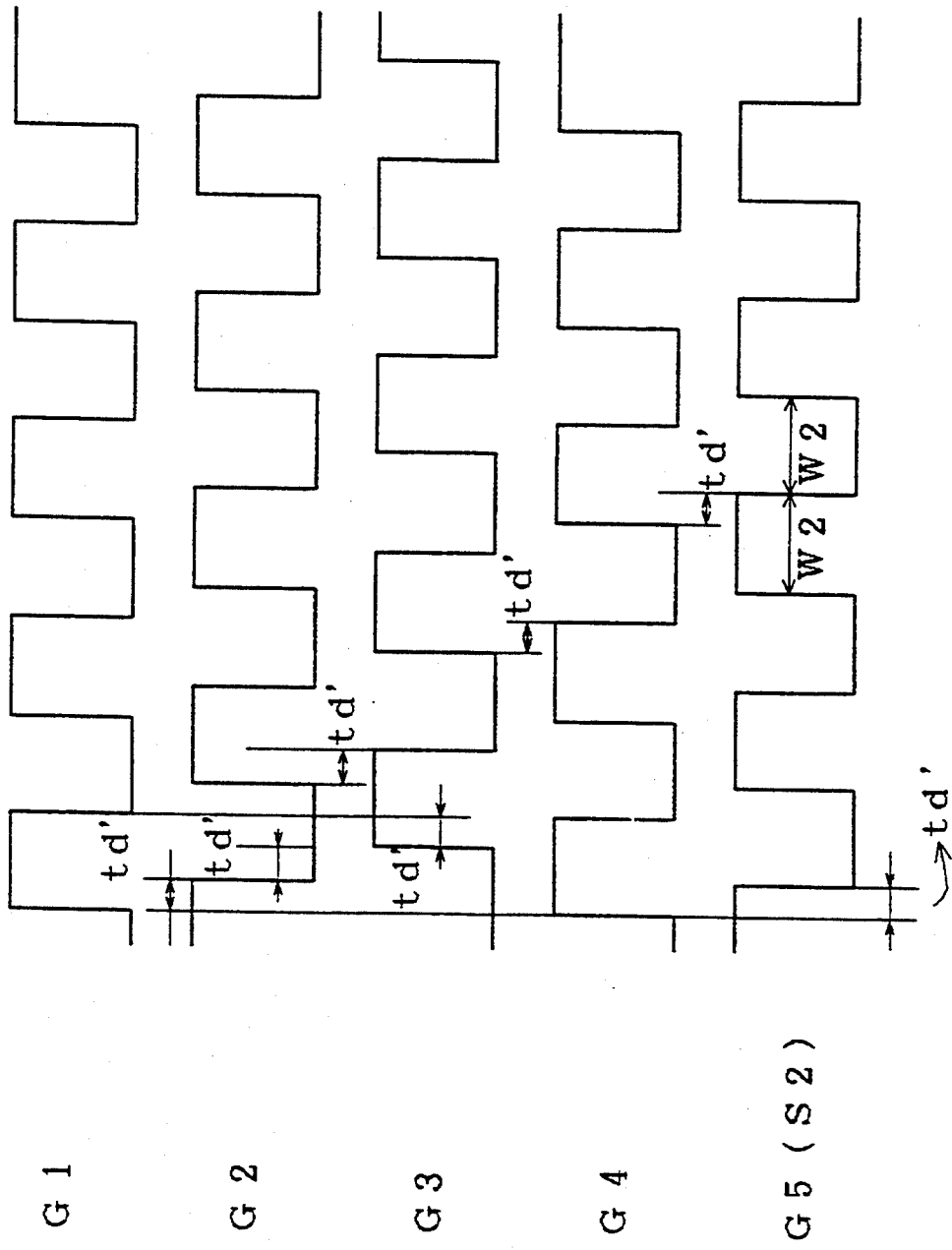

When the power supply voltage VDD is 3 V, the respective inverters G1 to G3 have a relatively long signal propagation delay time td' as shown in FIG. 8. The transistor size of the inverters G1 to G5 is previously set such that td'=(5/3)td is satisfied on the basis of experimental results such as simulation. At this time, the power supply detection signal S5 is "L", the CMOS transfer gate TF1 is on, and the CMOS transfer gate TF2 is off. Then the oscillation signal S2 is that produced by the three inverters G1 to G3 forming the loop. Consequently, the oscillation signal S2 has a pulse width W2=3·td'=5·td=W1.

As above described, if the signal propagation delay time of the individual inverters forming the loop changes with the potential change of the power supply VDD, the changes are cancelled by changing the number of inverters, thereby allowing the power supply VDD having two voltage values 5 V and 3 V to output the oscillation signal S2 having the same oscillation frequency f.

Figure 9:
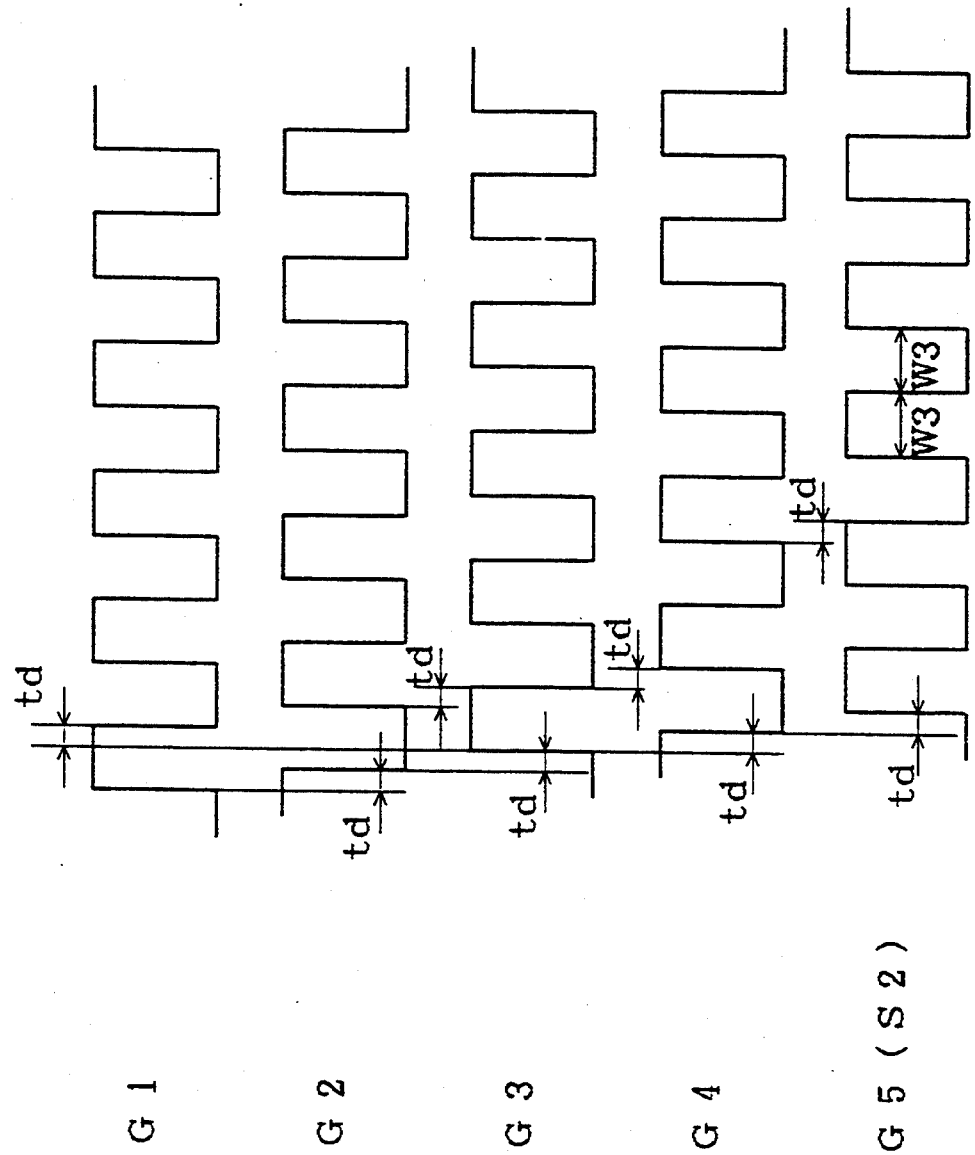

FIG. 9 is a timing chart of the operation of the ring oscillator where the voltage value of the power supply VDD is 5 V and the oscillation signal S2 is oscillated which is produced by the three inverters G1 to G3 forming the loop. As shown in FIG. 9, the oscillation signal S2 has a very short pulse width W3, that is, a very high oscillation frequency f.

Figure 10:
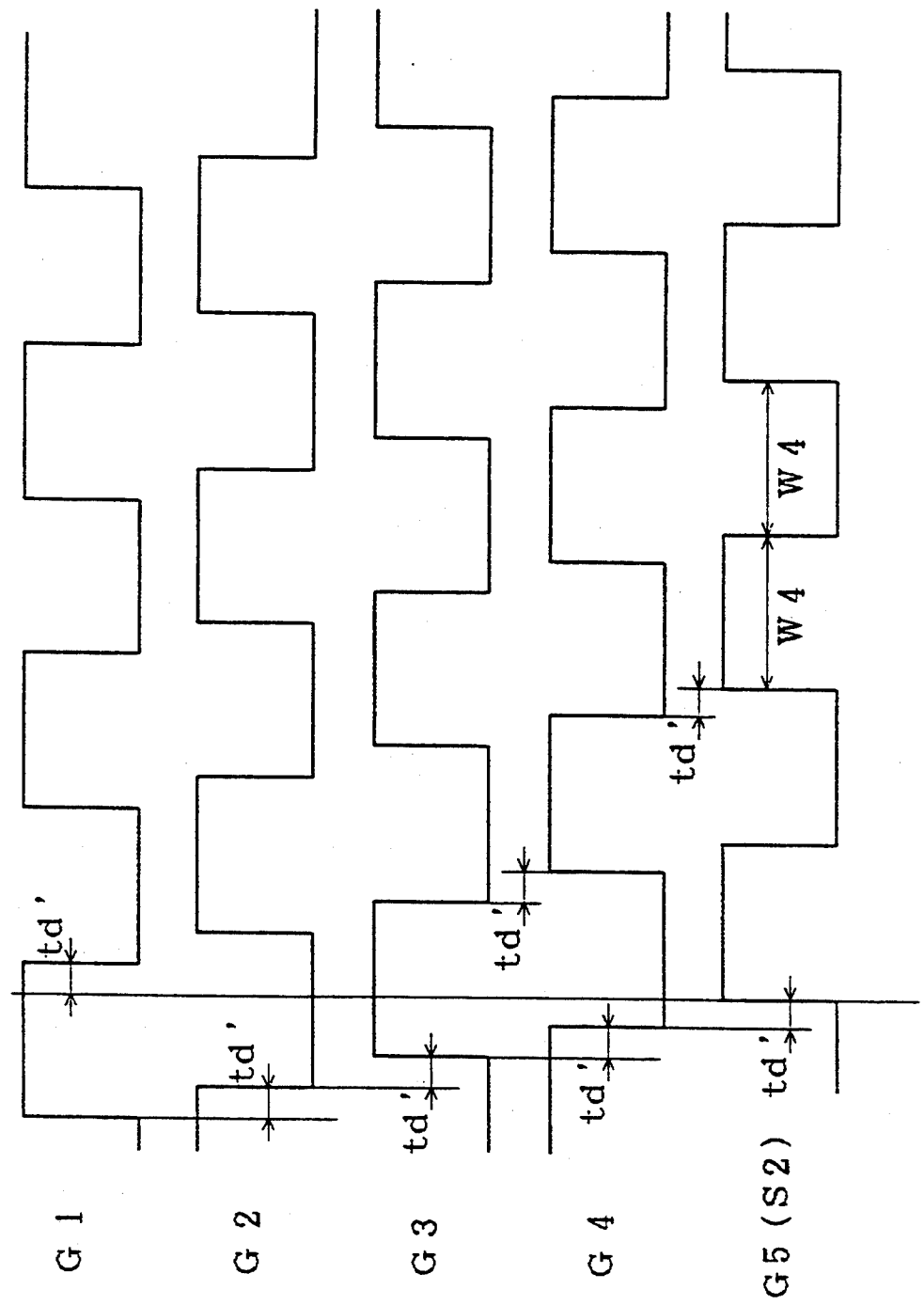

FIG. 10 is a timing chart of the operation of the ring oscillator where the voltage value of the power supply VDD is 3 V and the oscillation signal S2 is oscillated which is produced by the five inverters G1 to G5 forming the loop. As shown in FIG. 10, the oscillation signal has a very long pulse width W4, that is, a very low oscillation frequency f.

Figure 11:
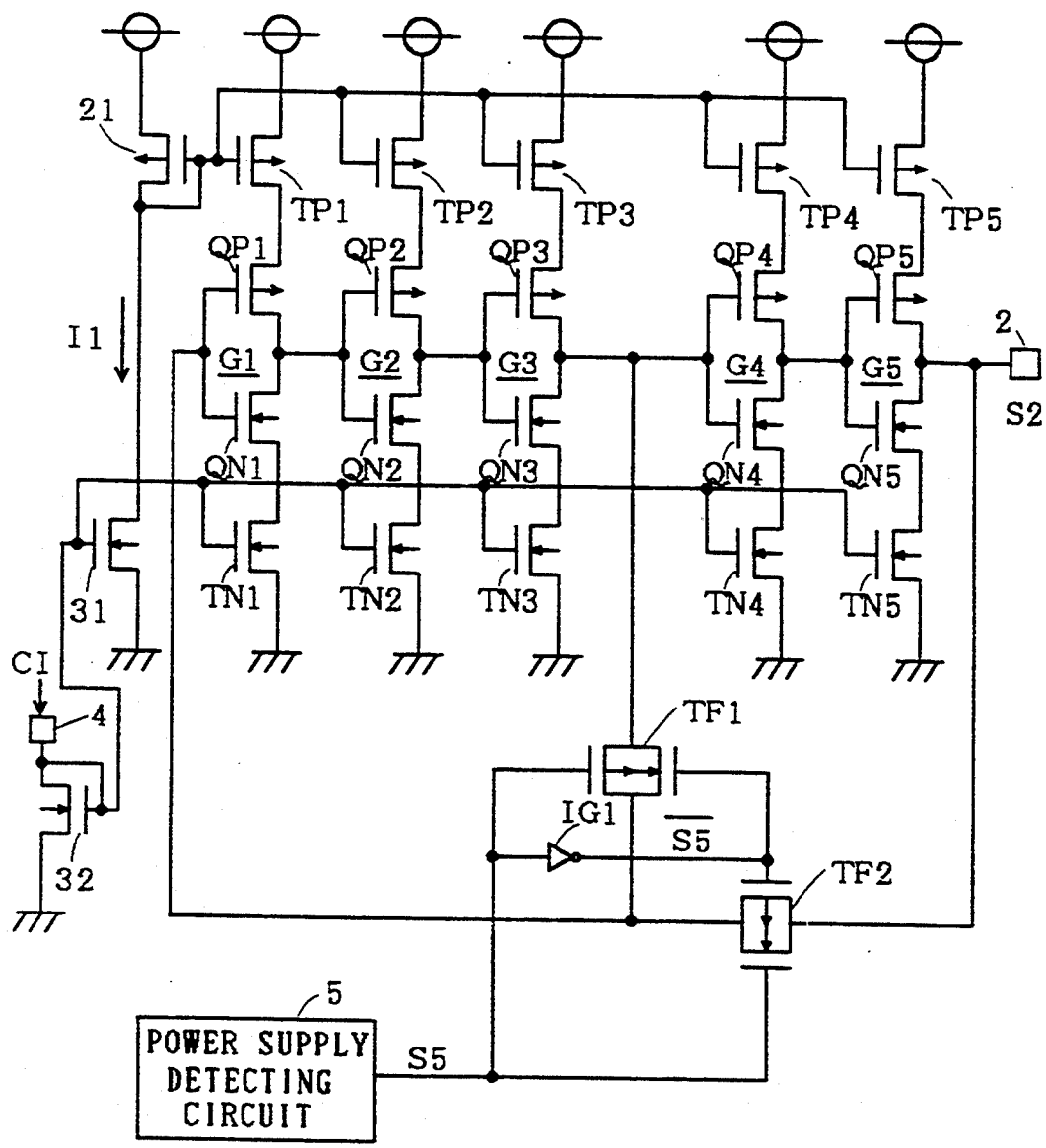
FIG. 11 is a circuit diagram of the ring oscillator of a second aspect of the second preferred embodiment according to the present invention.

FIG. 11 is a circuit diagram of the ring oscillator of a second aspect of the second preferred embodiment. As shown in FIG. 11, the NMOS transistor 32 is current-mirror connected to the NMOS transistor 31. The drain and gate of the NMOS transistor 32 are connected to the current control terminal 4, and the source thereof is grounded. The control current CI is applied to the current control terminal 4. Other constructions of FIG. 11 are similar to those of the ring oscillator of FIG. 5, and the description thereof will be omitted herein.

Like the ring oscillator of the second aspect of the first preferred embodiment shown in FIG. 2, such an arrangement enables the control current CI from the current control terminal 4 to control the source current of each inverter Gi, thereby to change the signal propagation delay time of each inverter Gi and, accordingly, the signal propagation delay time of all the inverters forming the loop. This permits accurate control of the oscillation frequency f of the oscillation signal S2.

Third Preferred Embodiment

The ring oscillator of a third preferred embodiment according to the present invention will be described below where N=n and K={3, 5, ..., (n-2)}.

Figure 12:
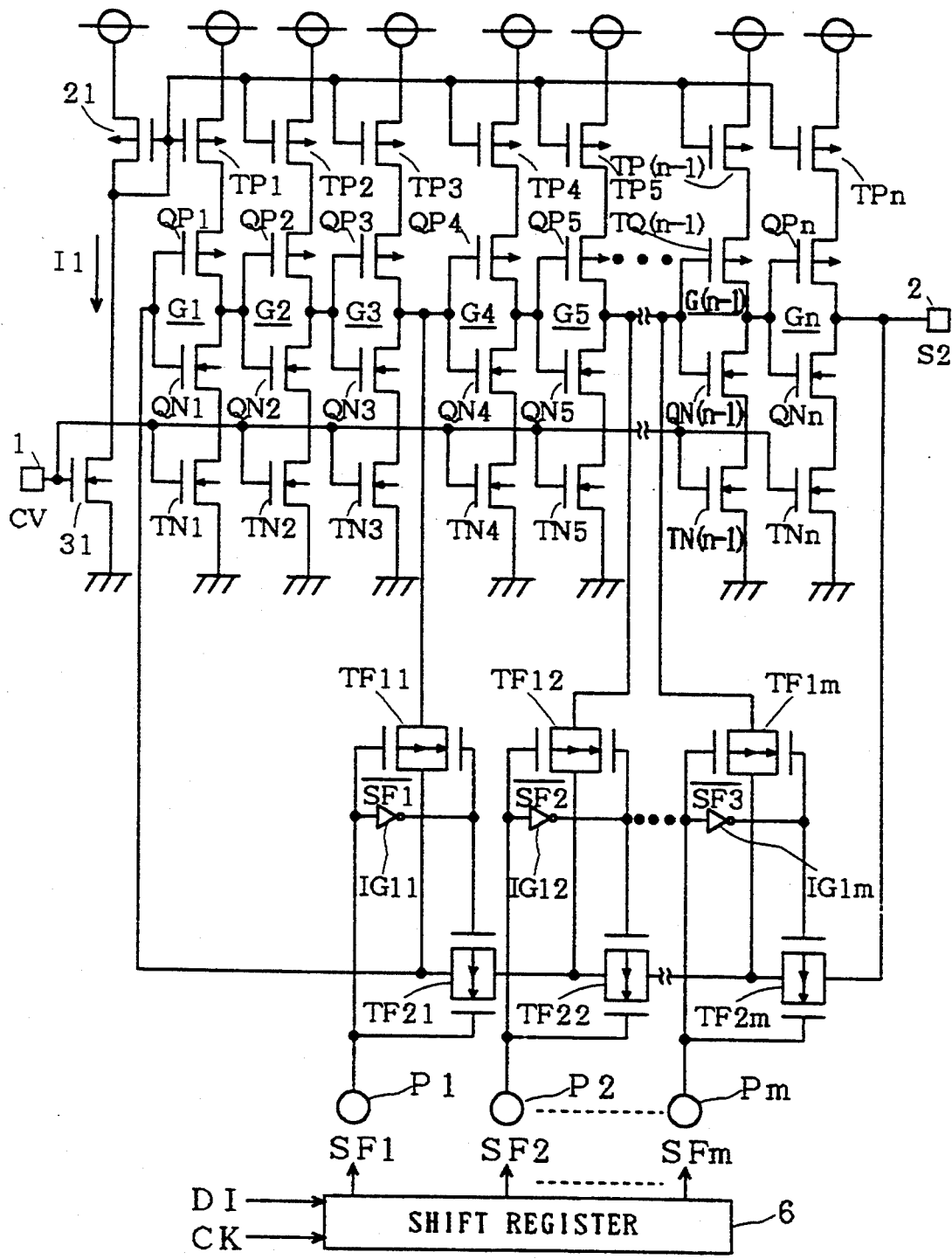
FIG. 12 is a circuit diagram of the ring oscillator of a first aspect of a third preferred embodiment according to the present invention.

FIG. 12 is a circuit diagram of the ring oscillator of a first aspect of the third preferred embodiment according to the present invention. As shown in FIG. 12, n inverters Gj (j=1 to n), or G1 to Gn, each basically comprised of a CMOS structure including in-series connected PMOS transistor QPj and NMOS transistor QNj are connected in series to form an inverter group, the output of the last inverter Gn being outputted in the form of the oscillation signal S2 from the output terminal 2.

A first loop output which is the output of the third inverter G3 is connected to the input of the first inverter GI through a transfer gate TF11, and a second loop output which is the output of the fifth inverter G5 is connected to the input of the inverter G1 through transfer gates TF12 and TF21.

Third to (m-1)-th loop outputs which are the outputs of the sixth to (n-3)-th inverters respectively, are connected to the input of the inverter G1 through a plurality of CMOS transfer gates (not shown), and an m-th loop output which is the output of the (n-2)-th inverter G(n-2) is connected to the input of the inverter G1 through CMOS transfer gates TF1m, TF2(m-1), ..., TF22, TF21. An (m+1)-th loop output which is the output of the last inverter is fed back to the input of the inverter G1 through CMOS transfer gates TF2m, ..., TF22, TF21.

A shift register 6 receives a clock signal CK and serial input data DI and serially accepts the serial input data DI in order in synchronism with the clock signal CK to output storage data having m-bit serial input data DI in parallel in the form of shift output signals SF1 to SFm to terminals P1 to Pm for switching the number of inverters forming a loop.

The respective shift output signals SFk ($1 \leq k \leq m$) provided through the terminals Pk for switching the number of inverters forming a loop are outputted to a PMOS gate of the CMOS transfer gates TF1k and an NMOS gate of the CMOS transfer gates TF2k. Inverters IG1k invert the shift output signals SFk to provide inverted shift output signals $\overline{SFk}$ which are in turn outputted to an NMOS gate of the CMOS transfer gates TF1k and a PMOS gate of the CMOS transfer gate TF2k.

Figure 13:
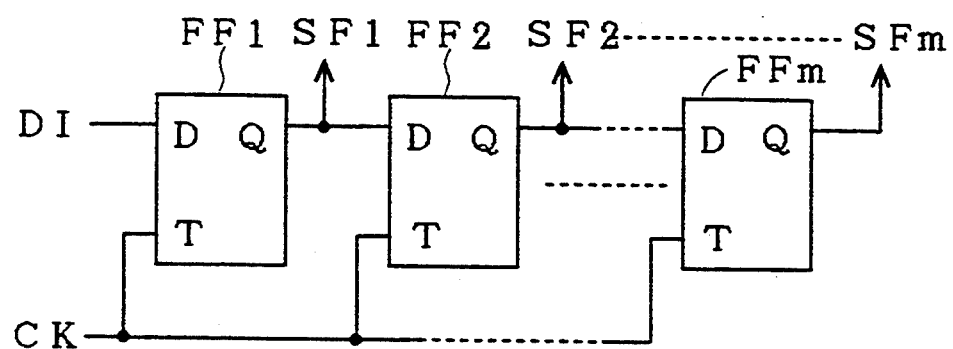
FIG. 13 is a circuit diagram showing the internal construction of a shift register shown in FIG. 12.

FIG. 13 is a circuit diagram showing the internal construction of the shift register 6 of FIG. 12. As shown in FIG. 13, m flip-flops FF1 to FFm are connected in series. The first flip-flop FF1 receives the serial input data DI at its D-input and the flip-flops FF1 to FFm commonly receive the clock signal CK at their T-input. The flip-flops FF1 to FFm output the shift output signals SF1 to SFm at their Q-output.

The serial input data DI are sequentially applied to the shift register 6, and the storage data are stored in the shift register 6 such that one of the shift output signals SF1 to SFm is "L" and the others are "H".

The shift output signals SF1 to SFm are applied respectively to the terminals P1 to Pm to make valid only one of the first to (m+1)-th loop outputs and feed it back to the input of the first inverter G1. This permits multi-stage changes in the number of inverters forming a loop in the ring oscillator and, accordingly, multi-stage changes in the oscillation frequency f of the oscillation signal S2 given from the output terminal 2.

In this manner, the oscillation frequency f of the oscillation signal S2 may be finely changed in a relatively wide range of frequency bands by multi-stage changes in the number of inverters forming the loop by "H"/"L" switching of the shift output signals SF1 to SFm applied to the terminals P1 to Pm.

In addition, use of the shift output signals SF1 to SFm of the shift register 6 as signals for multi-stage switching requires only two external inputs, i.e. the serial input data DI and the clock signal CK, thereby minimizing the number of external input pins.

Like the background art, the control voltage CV applied to the voltage control terminal 1 may control the source current of each inverter G1 to Gn to change the signal propagation delay time of each inverter G1 to Gn and, accordingly, the signal propagation delay time of all the inverters forming the loop. This permits changes of the oscillation frequency f the oscillation signal S2.

Figure 14:
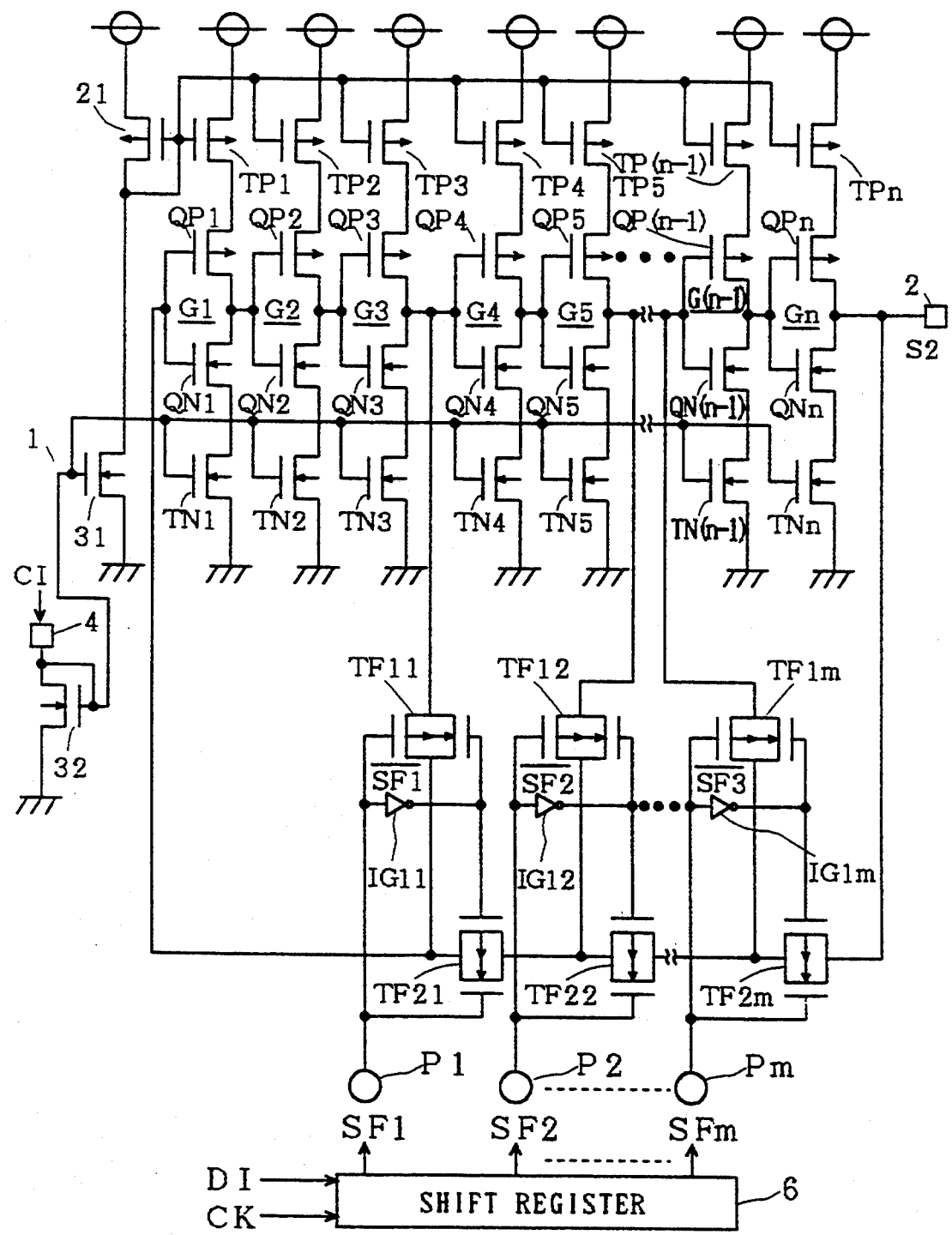
FIG. 14 is a circuit diagram of the ring oscillator of a second aspect of the third preferred embodiment according to the present invention.

FIG. 14 is a circuit diagram of the ring oscillator of a second aspect of the third preferred embodiment. As shown in FIG. 14, the NMOS transistor 32 is current-mirror connected to the NMOS transistor 31. The drain and gate of the NMOS transistor 32 are connected to the current control terminal 4, and the source thereof is grounded. The control current CI is applied to the current control terminal 4. Other constructions of FIG. 14 are similar to those of the ring oscillator of FIG. 12, and the description thereof will be omitted herein.

Like the ring oscillator of the second aspect of the first preferred embodiment shown in FIG. 2, such an arrangement enables the control current CI supplied from the current control terminal 4 to control the source current of each inverter Gj to change the signal propagation delay time of each inverter Gj and, accordingly, the signal propagation delay time of all the inverters forming the loop. This permits accurate control of the oscillation frequency f of the oscillation signal S2.

Fourth Preferred Embodiment

The ring oscillator of a fourth preferred embodiment according to the present invention will be described hereinafter where N=5 and K={3, 5}.

Figure 15:
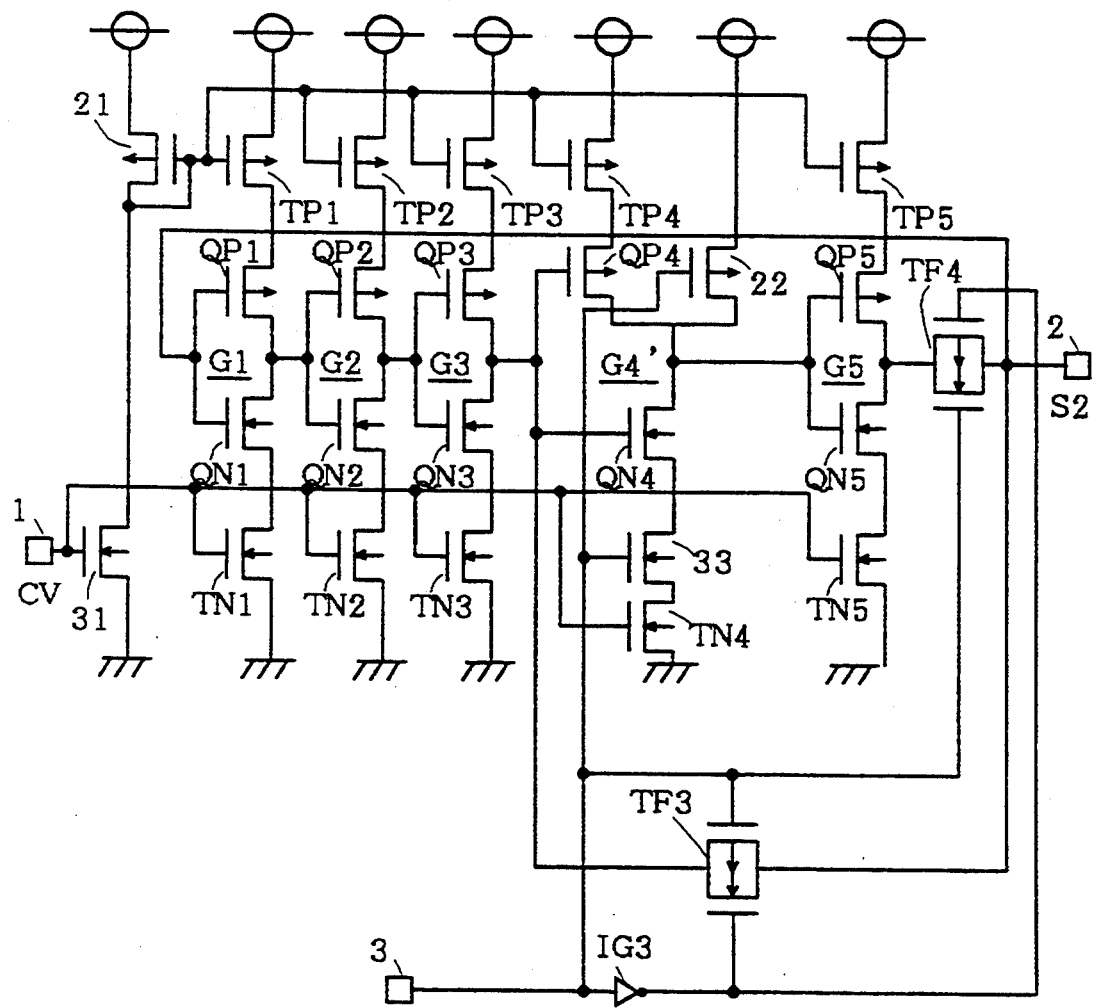
FIG. 15 is a circuit diagram of the ring oscillator of a first aspect of a fourth preferred embodiment according to the present invention.

FIG. 15 is a circuit diagram of the ring oscillator of a first aspect of the fourth preferred embodiment according to the present invention. As shown in FIG. 15, five inverters G1 to G3, G4', G5 are connected in series to form an inverter group, the output of the last inverter G5 being outputted in the form of the oscillation signal S2 from the output terminal 2.

The inverters G1 to G3 and G5 are basically comprised of CMOS structures including PMOS transistors QP1 to QP3 and QP5 and NMOS transistors QN1 to QN3 and QN5 connected in series, respectively. In the inverters G1 to G3 and G5, the sources of the PMOS transistors QP1 to QP3 and QP5 are connected to the power supply VDD through PMOS transistors TP1 to TP3 and TP5, and the sources of the NMOS ;transistors QN1 to QN3 and QN5 are grounded through NMOS transistors TN1 to TN3 and TN5, respectively.

The fourth inverter G4' basically comprises a CMOS structure including a PMOS transistor QP4 and an NMOS transistor QN4 connected in series and further comprises PMOS transistors TP4, 22 and NMOS transistors TN4, 33. The drains of the PMOS transistors QP4 and 22 are commonly connected to the drain of the NMOS transistor QN4, and the source of the NMOS transistor QN4 is connected to the drain of the NMOS transistor 33. The gates of the PMOS transistor QP4 and the NMOS transistor QN4 are commonly connected to the output of the inverter G3. The source of the PMOS transistor QP4 is connected to the power supply VDD through the PMOS transistor TP4, and the source of the NMOS transistor 33 is grounded through the NMOS transistor TN4.

The output of the third inverter G3 is connected to the input of the first inverter G1 and the output terminal 2 through a CMOS transfer gate TF3. The output of the last inverter G5 is connected to the input of the inverter G1 and the output terminal 2 through a CMOS transfer gate TF4.

The switching signal S3 from the terminal 3 is applied to a PMOS gate of the CMOS transfer gate TF3 and an NMOS gate of the CMOS transfer gate TF4. The inverter IG3 inverts the switching signal S3 to provide an inverted switching signal S3 which is in turn applied to an NMOS gate of the CMOS transfer gate TF3 and a PMOS gate of the CMOS transfer gate TF4.

The switching signal S3 is also applied to the gates of the PMOS transistor 22 and the NMOS transistor 33.

Thus the inverter G4 is equivalent in construction to a NAND gate which receives the output of the inverter G3 and the switching signal S3. As a result, the inverter G4' functions as a normal inverter which receives the output of the inverter G3 when the switching signal S3 is "H" and outputs a fixed value "H" independent of the output "H"/"L" of the inverter G3 when the switching signal S3 is "L".

The switching signal S3 controls the inverter G4' to perform one of the inverter function and fixed value output function.

The PMOS transistor 21 and the NMOS transistor 31 are connected in series between the power supply VDD and ground. The PMOS transistor 21 is current-mirror connected to the PMOS transistors TP1 to TP5. The gate of the NMOS transistor 31 is connected to the voltage control terminal 1 and is commonly connected to the NMOS transistors TN1 to TN5. The control voltage CV is applied to the voltage control terminal 1.

In such an arrangement, when the switching signal S3 is "H", the CMOS transfer gate TF3 is off, and the CMOS transfer gate TF4 is on, the output of the inverter G5 being electrically connected to the output terminal 2, the inverter G4' functioning as an inverter. Consequently, the five inverters G1 to G5 are connected in a loop, and the oscillation signal S2 produced by the five inverters G1 to G5 forming the loop is provided from the output terminal 2.

On the other hand, when the switching signal S3 is "L", the CMOS transfer gate TF3 is on, and the CMOS transfer gate TF4 is off, the output of the inverter G3 being electrically connected to the output terminal 2, the output of the inverter G4' being fixed to "H". Consequently, the three inverters G1 to G3 are connected in a loop, and the oscillation signal S2 produced by the three inverters G1 to G3 forming the loop is provided from the output terminal 2.

At this time, the outputs of the inverters G4' and G5 are fixed to "H" and "L", respectively.

Like the background art, the control voltage CV applied to the voltage control terminal I may control the source current of each inverter G1 to G3, G4', G5 to change the signal propagation delay time of each inverter Gi and, accordingly, the signal propagation delay time of all the inverters forming the loop. This permits changes of the oscillation frequency f of the oscillation signal S2.

Like the first preferred embodiment, the oscillation frequency f of the oscillation signal S2 may be changed in a relatively wide range of frequency bands by changing the number of inverters forming the loop between five and three by "H"/"L" switching of the switching signal S3.

In addition, when the three inverters form the loop, the output potentials at the inverters G4' and G5 which do not form the loop are fixed to reduce useless current consumption with the potential change in outputs of the inverters G4' and G5, as well as achieving less power consumption and restriction of noises.

Figure 16:
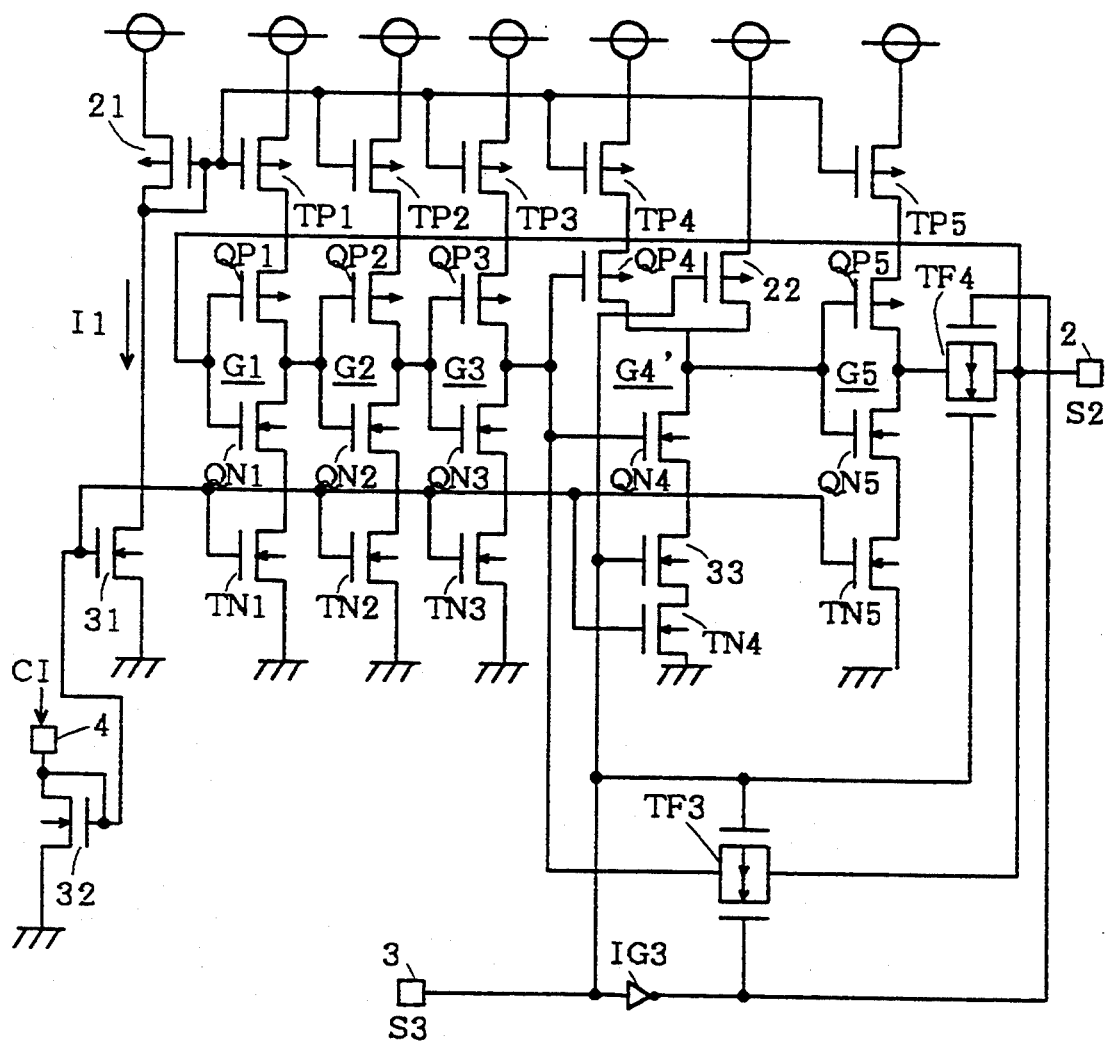
FIG. 16 is a circuit diagram of the ring oscillator of a second aspect of the fourth preferred embodiment according to the present invention.

FIG. 16 is a circuit diagram of the ring oscillator of a second aspect of the fourth preferred embodiment. As shown in FIG. 16, the NMOS transistor 32 is current-mirror connected to the NMOS transistor 31. The drain and gate of the NMOS transistor 32 are connected to the current control terminal 4, and the source thereof is grounded. The control current CI is applied to the current control terminal 4. Other constructions of FIG. 16 are similar to those of the ring oscillator shown in FIG. 15, and the description thereof will be omitted herein.

Like the ring oscillator of the second aspect of the first preferred embodiment shown in FIG. 2, such an arrangement enables the control current CI supplied from the current control terminal 4 to control the source current of each inverter Gi, to change the signal propagation delay time of each inverter Gi. This permits accurate control of the oscillation frequency f of the oscillation signal S2.

Fifth Preferred Embodiment

The ring oscillator of a fifth preferred embodiment according to the present invention will be described hereinafter where N=5.

Figure 17:
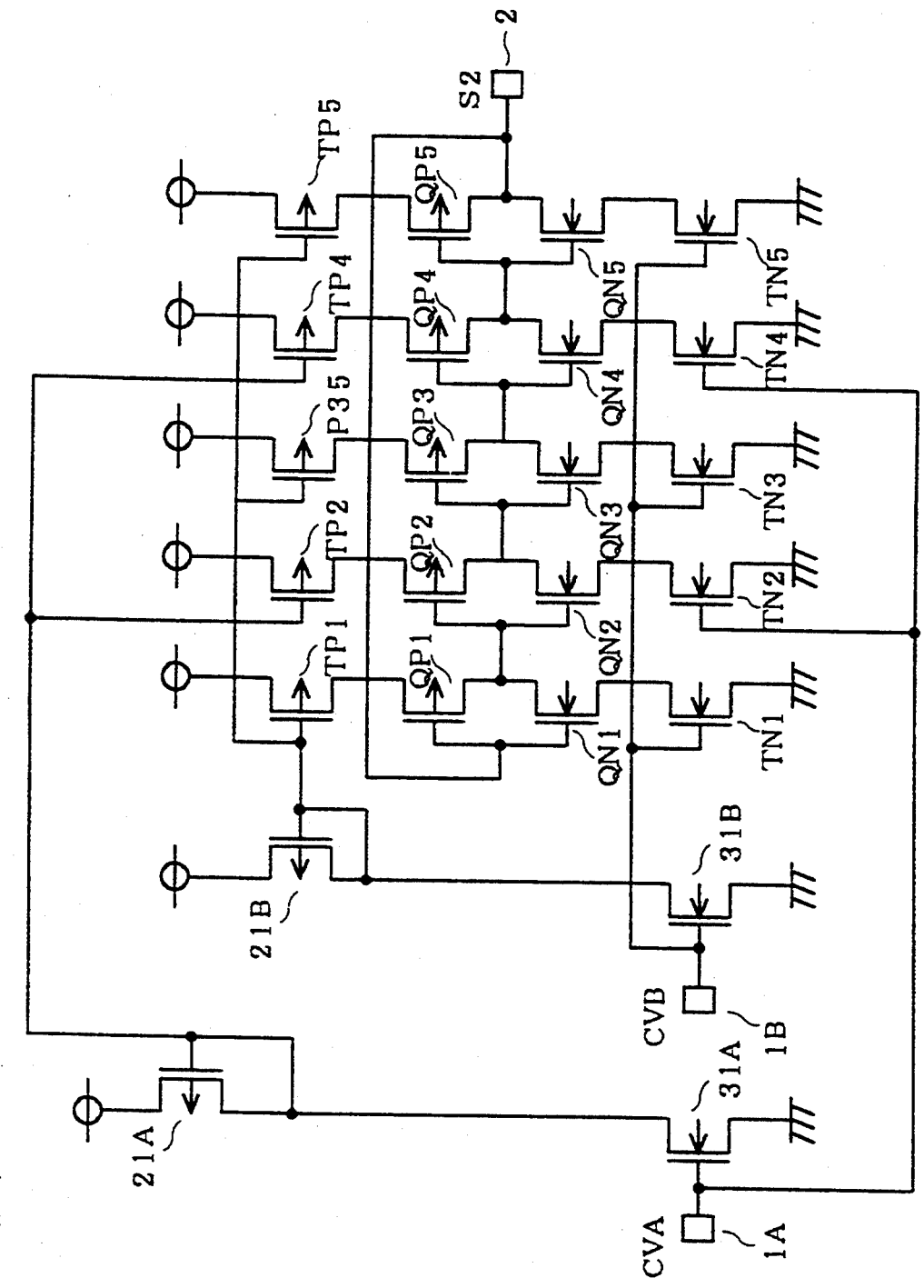
FIG. 17 is a circuit diagram of the ring oscillator of a fifth preferred embodiment according to the present invention.

FIG. 17 is a circuit diagram of the ring oscillator of the fifth preferred embodiment according to the present invention. As shown in FIG. 17, five inverters Gi (i=1 to 5), or G1 to G5, each basically comprised of a CMOS structure including in-series connected PMOS transistor QPi and NMOS transistor QNi are connected in series to form an inverter group, the output of the last inverter G5 being outputted in the form of the oscillation signal S2 from the output terminal 2 and fed back to the input of the first inverter G1.

In each inverter Gi, the source of the PMOS transistor QPi is connected to the power supply VDD through the PMOS transistor TPi and the source of the NMOS transistor QNi is grounded through the NMOS transistors TNi.

A PMOS transistor 21A and an NMOS transistor 31A are connected in series between the power supply VDD and ground. A PMOS transistor 21B and an NMOS transistor 31B are connected in series between the power supply VDD and ground.

The PMOS transistor 21A is current-mirror connected to the PMOS transistors TP2 and TP4. The gate of the NMOS transistor 31A is connected to a voltage control terminal 1A and commonly connected to the NMOS transistors TN2 and TN4. A control voltage CVA is applied to the voltage control terminal 1A.

The PMOS transistor 21B is current-mirror connected to the PMOS transistors TP1, TP3, TP5. The gate of the NMOS transistor 31B is connected to a voltage control terminal 1B and commonly connected to the NMOS transistors TN1, TN3, TN5. A control voltage CVB is applied to the voltage control terminal 1B.

Such an arrangement enables the control voltage CVA applied to the voltage control terminal 1A to control the source current of the inverters G2, G4 to change the signal propagation delay time of the inverters G2, G4, and enables the control voltage CVB applied to the voltage control terminal 1B to control the source current of the inverters G1, G3, G5 to change the signal propagation delay time of the inverters G1, G3, G5. Changing the signal propagation delay time of all the inverters forming the loop permits changes of the oscillation frequency f of the oscillation signal S2.

Figure 18:
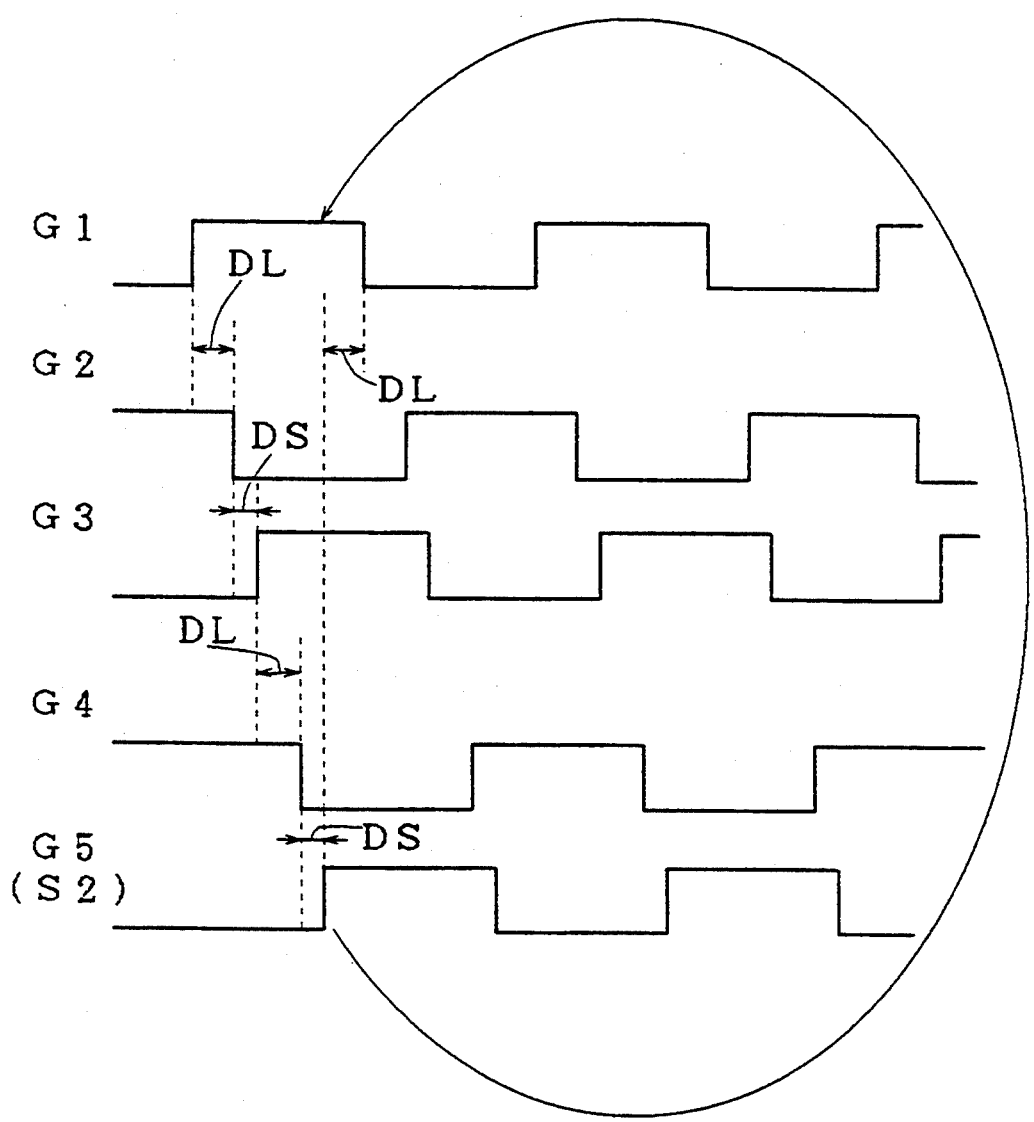
FIG. 18 is a timing chart showing the operation of the ring oscillator of FIG. 17.
Figure 19:
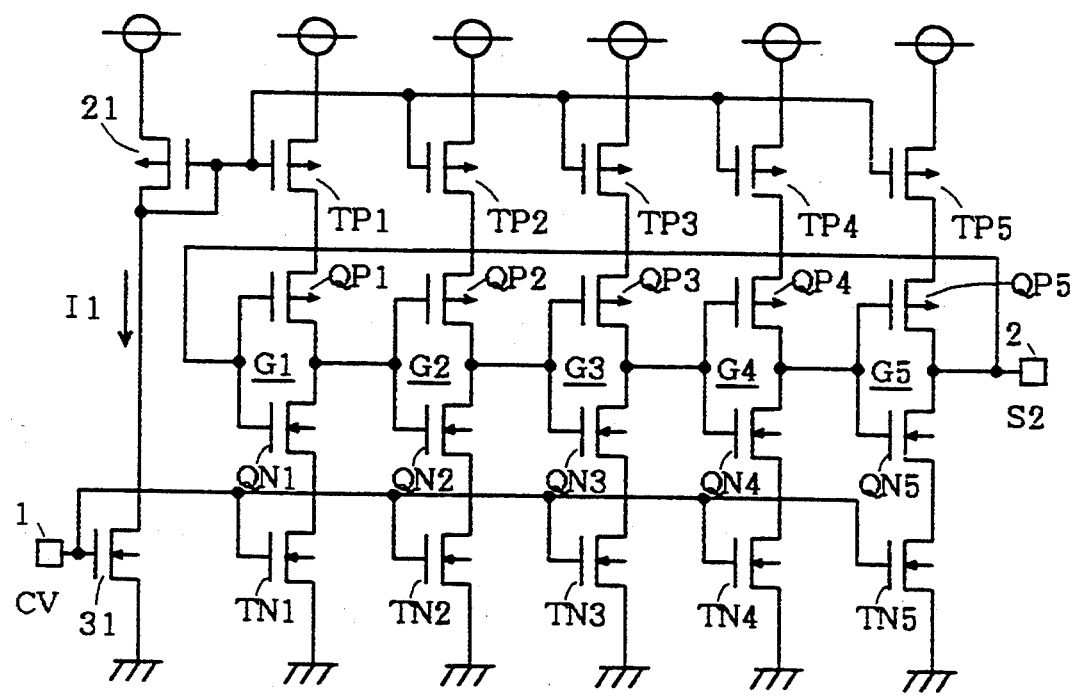
FIG. 19 is a circuit diagram of a conventional ring oscillator.
Figure 20:
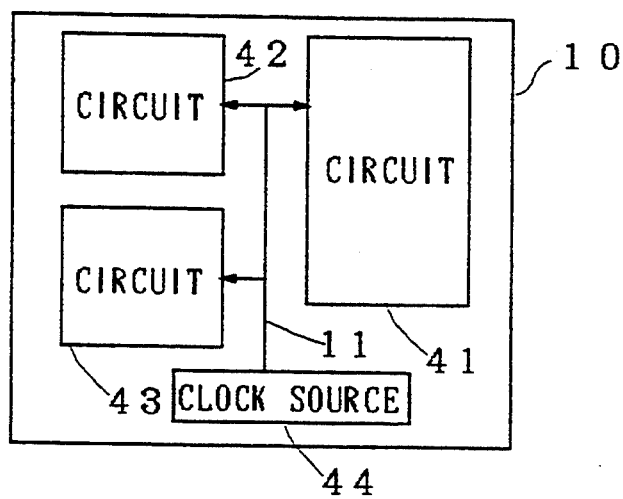
FIGS. 20 and 21 illustrate applications of the ring oscillator.
Figure 21:
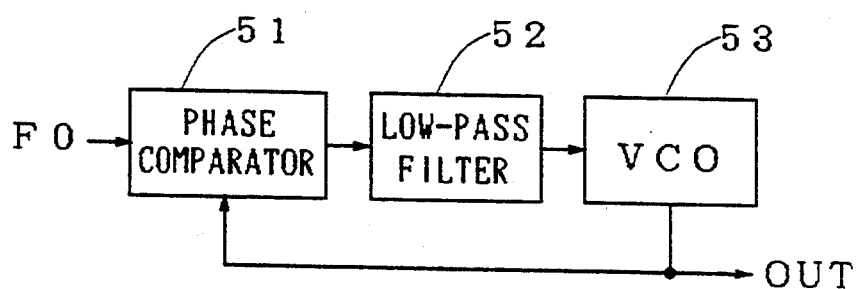

FIG. 18 is a timing chart showing the operation of the ring oscillator of the fifth preferred embodiment. As shown in FIG. 18, by independently setting the control voltages CVA and CVB, the control voltage CVB may be made relatively low to set a relatively long signal propagation delay time DL of the inverters G1, G3, G5, whereas the control voltage CVA may be made relatively high, for example a value approximate to the power supply voltage VDD, to set a relatively short signal propagation delay time of the inverters G2, G4. Thus the control voltage CVB controls rough changes of the pulse width of the oscillation signal S2 and the control voltage CVA controls fine changes thereof.

The result is the oscillation frequency f of the oscillation signal S2 which is set to a correct value while changing in a relatively wide range of frequency bands on the basis of the control voltages CVA and CVB.

Other Embodiments

In the first to fourth preferred embodiments, the number N of inverters forming the inverter group is an odd number which satisfies N≥5, and the number K of inverters forming a loop satisfies 3≤K≤N. However, since it is in principle possible to output an oscillation signal from an inverter group including one inverter forming the loop, the number K may be an odd number which satisfies 1≤K≤N and the number N may be an odd number which satisfies N≥3.

However, in practice, it is preferred that the number N is an odd number which satisfies N≥5 and the number K is an odd number which satisfies 3≤K≤N as described in the first to fourth preferred embodiments.

While the invention has been shown and described in detail, the foregoing description is in all aspects illustrative and not restrictive. It is therefore understood that numerous modifications and variations can be devised without departing from the scope of the invention.

What is claimed is:

1. A ring oscillator comprising:
   an inverter group including first to N-th inverters (N is an odd number satisfying N≥3) connected in series, the output of the N-th inverter being outputted to the exterior in the form of an oscillation signal, and
   switching means receiving a switching signal for determining the number K of inverters (K is an odd number satisfying 1≤K≤N) forming a loop in said inverter group on the basis of said switching signal to feed back the output of the K-th inverter to the input of the first inverter, said switching means using the (K+1)-th to N-th inverters in said inverter group as a buffer for deriving said oscillation signal when K≤N.

2. The ring oscillator of claim 1, further comprising:
   voltage control means receiving a control voltage from the exterior for changing the amount of current flowing in each of said inverters in said inverter group on the basis of said control voltage to control a signal propagation delay time of each of said inverters.

3. The ring oscillator of claim 1, further comprising:
   current control means receiving a control current from the exterior for changing the amount of current flowing in each of said inverters in said inverter group on the basis of said control current to control a signal propagation delay time of each of said inverters.

4. A ring oscillator comprising:
an inverter group including first to N-th inverters (N is an odd number satisfying $N \geq 3$) connected in series;
power supply detecting means receiving a power supply voltage for outputting a power supply detection signal on the basis of the value of said power supply voltage; and
switching means for determining the number K of inverters (K is an odd number satisfying $1 \leq K \leq N$) forming a loop in said inverter group on the basis of said power supply detection signal to feed back the output of the K-th inverter to the input of the first inverter and provide the output of the K-th inverter in the form of an oscillation signal.

5. The ring oscillator of claim 4, wherein said power supply detecting means includes:
power supply voltage value detecting means including a plurality of transistors diode connected in series between power supply and ground, said plurality of transistors presenting a first state in which all of said transistors are fully on when the voltage of said power supply has a first voltage value and presenting a second state in which some of said transistors are not fully on when the voltage of said power supply has a second voltage value, and
power supply detection signal output means for outputting said power supply detection signal on the basis of said first/second state of said plurality of transistors.

6. The ring oscillator of claim 5, further comprising:
voltage control means receiving a control voltage from the exterior for changing the amount of current flowing in each of said inverters in said inverter group on the basis of said control voltage to control a signal propagation delay time of each of said inverters.

7. The ring oscillator of claim 5, further comprising:
current control means receiving a control current from the exterior for changing the amount of current flowing in each of said inverters in said inverter group on the basis of said control current to control a signal propagation delay time of each of said inverters.

8. A ring oscillator comprising:
an inverter group including first to N-th inverters (N is an odd number satisfying $N \geq 3$) connected in series;
a shift register serially receiving serial input data for outputting storage data having said serial input data in parallel in the form of a plurality of shift output signals; and
switching means for determining the number K of inverters (K is an odd number satisfying $1 \leq K \leq N$) forming a loop in said inverter group on the basis of said plurality of shift output signals to feed back the output of the K-th inverter to the input of the first inverter and provide the output of the K-th inverter in the form of an oscillation signal.

9. The ring oscillator of claim 8, wherein
said shift register includes a plurality of in-series connected flip-flops receiving a common clock signal from the exterior at their clock input, the first flip-flop receiving said serial input data at its data input, said respective flip-flops outputting said plurality of shift output signals at their data output.

10. The ring oscillator of claim 9, further comprising:
voltage control means receiving a control voltage from the exterior for changing the amount of current flowing in each of said inverters in said inverter group on the basis of said control voltage to control a signal propagation delay time of each of said inverters.

11. The ring oscillator of claim 9, further comprising:
current control means receiving a control current from the exterior for changing the amount of current flowing in each of said inverters in said inverter group on the basis of said control current to control a signal propagation delay time of each of said inverters.

12. A ring oscillator comprising:
an inverter group including first to N-th inverters (N is an odd number satisfying $N \geq 3$) connected in series; and
switching means receiving a switching signal for determining the number K of inverters (K is an odd number satisfying $1 \leq K \leq N$) forming a loop in said inverter group on the basis of said switching signal to feed back the output of the K-th inverter to the input of the first inverter and output the output of the K-th inverter in the form of an oscillation signal, said switching means fixing the output values of the (K+1)-th to N-th inverters in said inverter group when $K \leq N$.

13. The ring oscillator of claim 12, wherein at least one of said N inverters is an inverter with state control function having a state control signal input portion and having an inverter function for logically inverting an input to output an inverted signal and a fixed value output function for outputting a fixed output value independent of an input, one of said inverter function and said fixed value output function being determined on the basis of a signal applied to said state control signal input portion, and
said switching means outputs a state control signal indicative of one of said inverter function and said fixed value output function to said state control signal input portion of said inverter with state control function on the basis of said switching signal.

14. The ring oscillator of claim 13, further comprising:
current amount control means receiving a control voltage for changing the amount of current flowing in each of said inverters in said inverter group on the basis of said control voltage.

15. The ring oscillator of claim 13, further comprising:
current amount control means receiving a control current for changing the amount of current flowing in each of said inverters in said inverter group on the basis of said control current.

16. An ring oscillator comprising:
an inverter group including first to N-th inverters (N is an odd number satisfying $N \geq 3$) connected in series for feeding back the output of the N-th inverter to the input of the first inverter and providing the output of the N-th inverter in the form of an oscillation signal;
first current amount control means receiving a first control voltage for changing the amount of current flowing in some of said N inverters forming said inverter group on the basis of said first control voltage; and
second current amount control mean receiving a second control voltage for changing the amount of current flowing in some others of said N inverters forming said inverter group on the basis of said second control voltage.

* * * * *